(12) United States Patent
Byun et al.

(10) Patent No.: US 10,515,916 B2
(45) Date of Patent: Dec. 24, 2019

(54) FAN-OUT SEMICONDUCTOR PACKAGE

(71) Applicant: SAMSUNG ELECTRONICS CO., LTD., Suwon-si (KR)

(72) Inventors: Dae Jung Byun, Suwon-Si (KR); Byung Ho Kim, Suwon-Si (KR); Pyung Hwa Han, Suwon-Si (KR); Joo Young Choi, Suwon-Si (KR); Ung Hui Shin, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/025,267

(22) Filed: Jul. 2, 2018

(65) Prior Publication Data

US 2018/0308815 A1    Oct. 25, 2018

Related U.S. Application Data

(63) Continuation of application No. 15/595,226, filed on May 15, 2017, now Pat. No. 10,157,868.

(30) Foreign Application Priority Data

Aug. 30, 2016   (KR) ........................ 10-2016-0111090

(51) Int. Cl.
*H01L 23/48*    (2006.01)
*H01L 23/00*    (2006.01)
(Continued)

(52) U.S. Cl.
CPC .............. *H01L 24/09* (2013.01); *H01L 23/28* (2013.01); *H01L 23/5226* (2013.01);
(Continued)

(58) Field of Classification Search
CPC ................. H01L 23/28; H01L 23/5226; H01L 2224/0235; H01L 2224/02377; H01L 2224/02379
(Continued)

(56) References Cited

U.S. PATENT DOCUMENTS 5,521,435 A    5/1996   Mizukoshi
5,866,943 A    2/1999   Mertol
(Continued)

FOREIGN PATENT DOCUMENTS

JP        2012-039090 A      2/2012
KR    10-2013-0132162 A    12/2013
(Continued)

OTHER PUBLICATIONS

Notice of Allowance issued in related U.S. Appl. No. 15/595,226, dated Aug. 10, 2018.
(Continued)

*Primary Examiner* — Nitin Parekh
(74) *Attorney, Agent, or Firm* — Sughrue Mion, PLLC

(57) ABSTRACT

A fan-out semiconductor package includes: a first interconnection member having a through-hole; a semiconductor chip disposed in the through-hole and having an active surface having connection pads disposed thereon and an inactive surface; a second interconnection member disposed on the first interconnection member and the active surface of the semiconductor chip and including a redistribution layer electrically connected to the connection pads; and an encapsulant encapsulating at least portions of the first interconnection member and the semiconductor chip. The first interconnection member includes a first insulating layer in contact with the second interconnection member, a first redistribution layer disposed on a surface of the first insulating layer in contact with the second interconnection
(Continued)

member and electrically connected to the connection pads, and a blocking layer disposed on the surface of the first insulating layer on which the first redistribution layer is disposed and surrounding the through-hole.

20 Claims, 16 Drawing Sheets

(51) Int. Cl.
    *H01L 23/28*     (2006.01)
    *H01L 23/522*     (2006.01)

(52) U.S. Cl.
    CPC .............. *H01L 24/06* (2013.01); *H01L 24/19* (2013.01); *H01L 24/20* (2013.01); *H01L 24/24* (2013.01); *H01L 24/25* (2013.01); *H01L 24/82* (2013.01); *H01L 24/05* (2013.01); *H01L 24/13* (2013.01); *H01L 2224/0235* (2013.01); *H01L 2224/02375* (2013.01); *H01L 2224/02377* (2013.01); *H01L 2224/02379* (2013.01); *H01L 2224/02381* (2013.01); *H01L 2224/0401* (2013.01); *H01L 2224/04105* (2013.01); *H01L 2224/05559* (2013.01); *H01L 2224/05569* (2013.01); *H01L 2224/05572* (2013.01); *H01L 2224/06165* (2013.01); *H01L 2224/06167* (2013.01); *H01L 2224/12105* (2013.01); *H01L 2224/131* (2013.01); *H01L 2224/13023* (2013.01); *H01L 2224/13024* (2013.01); *H01L 2224/16238* (2013.01); *H01L 2224/18* (2013.01); *H01L 2224/20* (2013.01); *H01L 2224/221* (2013.01); *H01L 2224/244* (2013.01); *H01L 2224/24155* (2013.01); *H01L 2224/25171* (2013.01); *H01L 2224/25175* (2013.01); *H01L 2924/15153* (2013.01); *H01L 2924/15311* (2013.01); *H01L 2924/3511* (2013.01)

(58) Field of Classification Search
    USPC ................................................ 257/773, 787
    See application file for complete search history.

(56) References Cited

U.S. PATENT DOCUMENTS

| | | |
|---|---|---|
| 6,114,763 A | 9/2000 | Smith |
| 6,309,915 B1 | 10/2001 | Distefano |
| 6,501,175 B2 | 12/2002 | Yamashita |
| 7,944,039 B2 | 5/2011 | Arai |
| 8,941,225 B2 | 1/2015 | Choi et al. |
| 9,728,498 B2 | 8/2017 | Su et al. |
| 2009/0243065 A1 | 10/2009 | Sugino et al. |
| 2012/0013021 A1 | 1/2012 | Kobayashi et al. |
| 2013/0249101 A1 | 9/2013 | Lin et al. |
| 2013/0307140 A1* | 11/2013 | Huang ................ H01L 23/3128 257/737 |
| 2014/0160688 A1 | 6/2014 | Lu et al. |
| 2014/0360765 A1* | 12/2014 | Kiwanami ............. H05K 1/185 174/260 |
| 2015/0187742 A1* | 7/2015 | Kwon |
| 2016/0013152 A1 | 1/2016 | Yu et al. |
| 2016/0071779 A1* | 3/2016 | Chen ...................... H01L 23/31 257/787 |
| 2016/0190107 A1* | 6/2016 | Meyer .................... H01L 23/31 257/686 |
| 2016/0233166 A1 | 8/2016 | Teh et al. |

FOREIGN PATENT DOCUMENTS

| | | |
|---|---|---|
| KR | 10-1362714 B1 | 2/2014 |
| KR | 10-2016-0024379 A | 3/2016 |

OTHER PUBLICATIONS

Taiwanese Office Action issued in corresponding Taiwanese Patent Application No. 106115908, dated May 31, 2018, with English Translation.
Office Action issued in corresponding Korean Patent Application No. 10-2016-0111090, dated Jul. 30, 2018.
Non-Final Office Action issued in related parent U.S. Appl. No. 15/595,226, dated Apr. 19, 2018.

\* cited by examiner

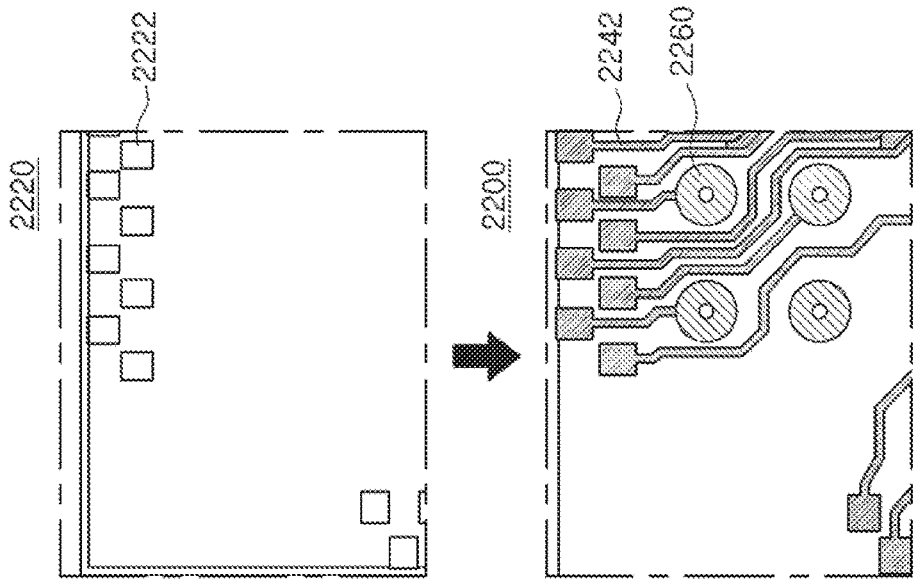
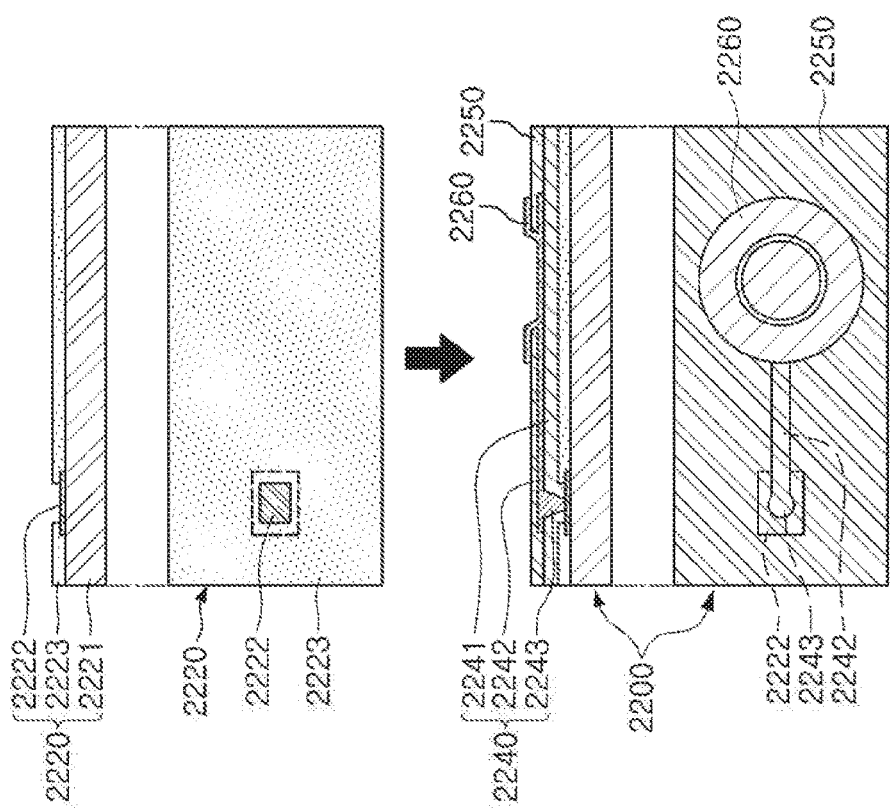
FIG. 3B
FIG. 3A

II-II'

III-III'

IV-IV'

V-V'

VI-VI'

FAN-OUT SEMICONDUCTOR PACKAGE

CROSS-REFERENCE TO RELATED APPLICATION(S)

This application is a Continuation of U.S. patent application Ser. No. 15/595,226 filed on May 15, 2017, which claims benefit of priority to Korean Patent Application No. 10-2016-0111090 filed on Aug. 30, 2016 in the Korean Intellectual Property Office, the disclosure of which are incorporated herein by reference in their entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

A significant recent trend in the development of technology related to semiconductor chips has been to reduce the size of semiconductor chips. Therefore, in the case of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a bleeding defect due to an encapsulant may be improved.

According to an aspect of the present disclosure, a fan-out semiconductor package may be provided, in which an interconnection member having a redistribution layer is introduced into a region in which a semiconductor chip is encapsulated and a blocking layer that may prevent an encapsulant from bleeding into the redistribution layer is formed in the interconnection member.

According to an aspect of the present disclosure, a fan-out semiconductor package may include: a first interconnection member having a through-hole; a semiconductor chip disposed in the through-hole and having an active surface having connection pads disposed thereon and an inactive surface opposing the active surface; a second interconnection member disposed on the first interconnection member and the active surface of the semiconductor chip and including a redistribution layer electrically connected to the connection pads; and an encapsulant encapsulating at least portions of the first interconnection member and the inactive surface of the semiconductor chip. The first interconnection member includes a first insulating layer in contact with the second interconnection member, a first redistribution layer disposed on a surface of the first insulating layer in contact with the second interconnection member and electrically connected to the connection pads, and a blocking layer disposed on the surface of the first insulating layer on which the first redistribution layer is disposed and surrounding the through-hole.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
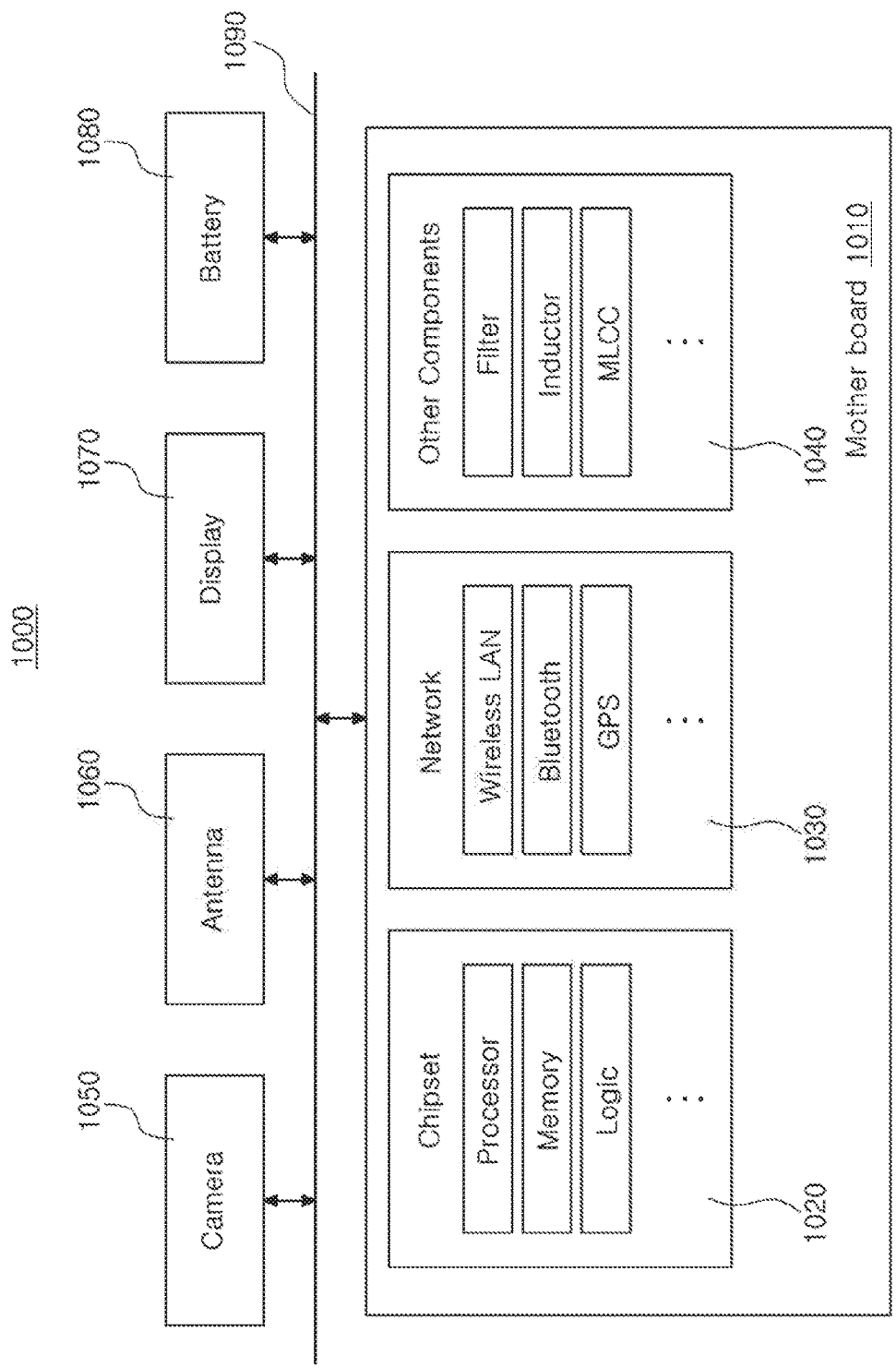
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or omitted for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are as depicted in the attached drawings. For example, a first interconnection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure.

In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mother board 1010 therein. The mother board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
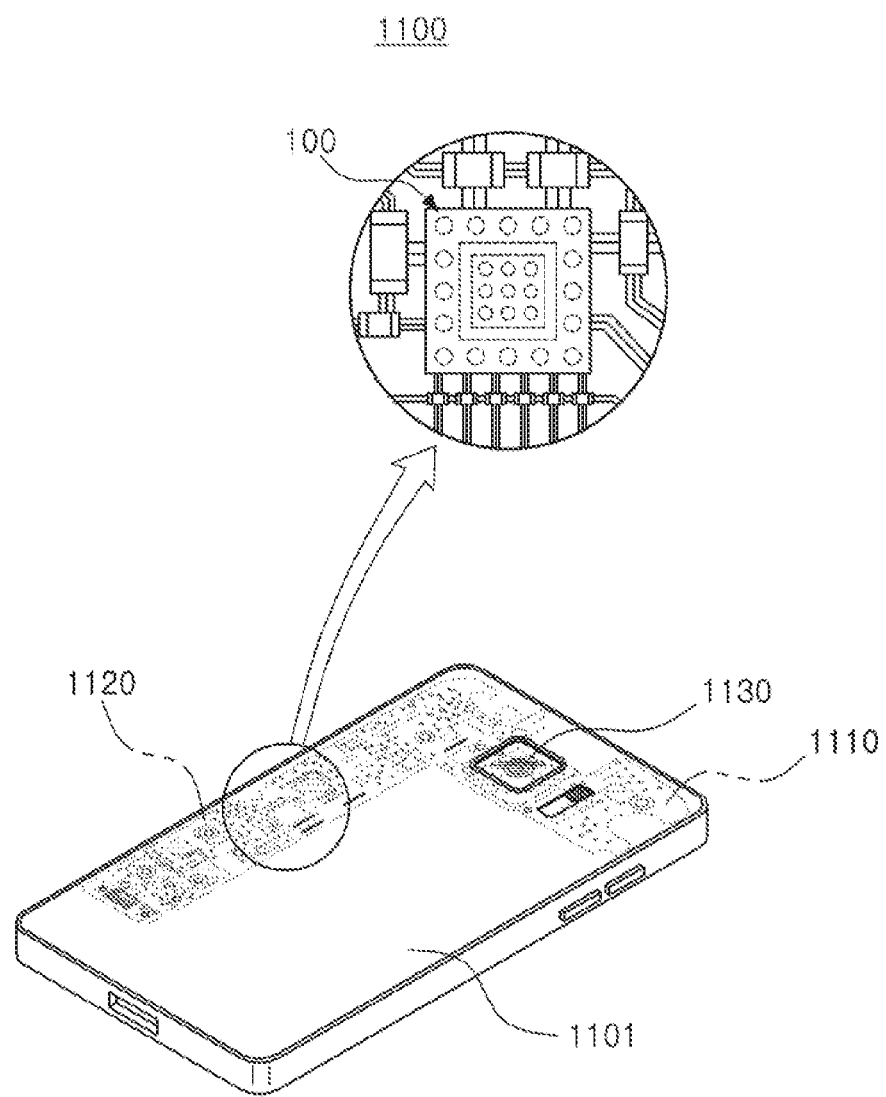
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
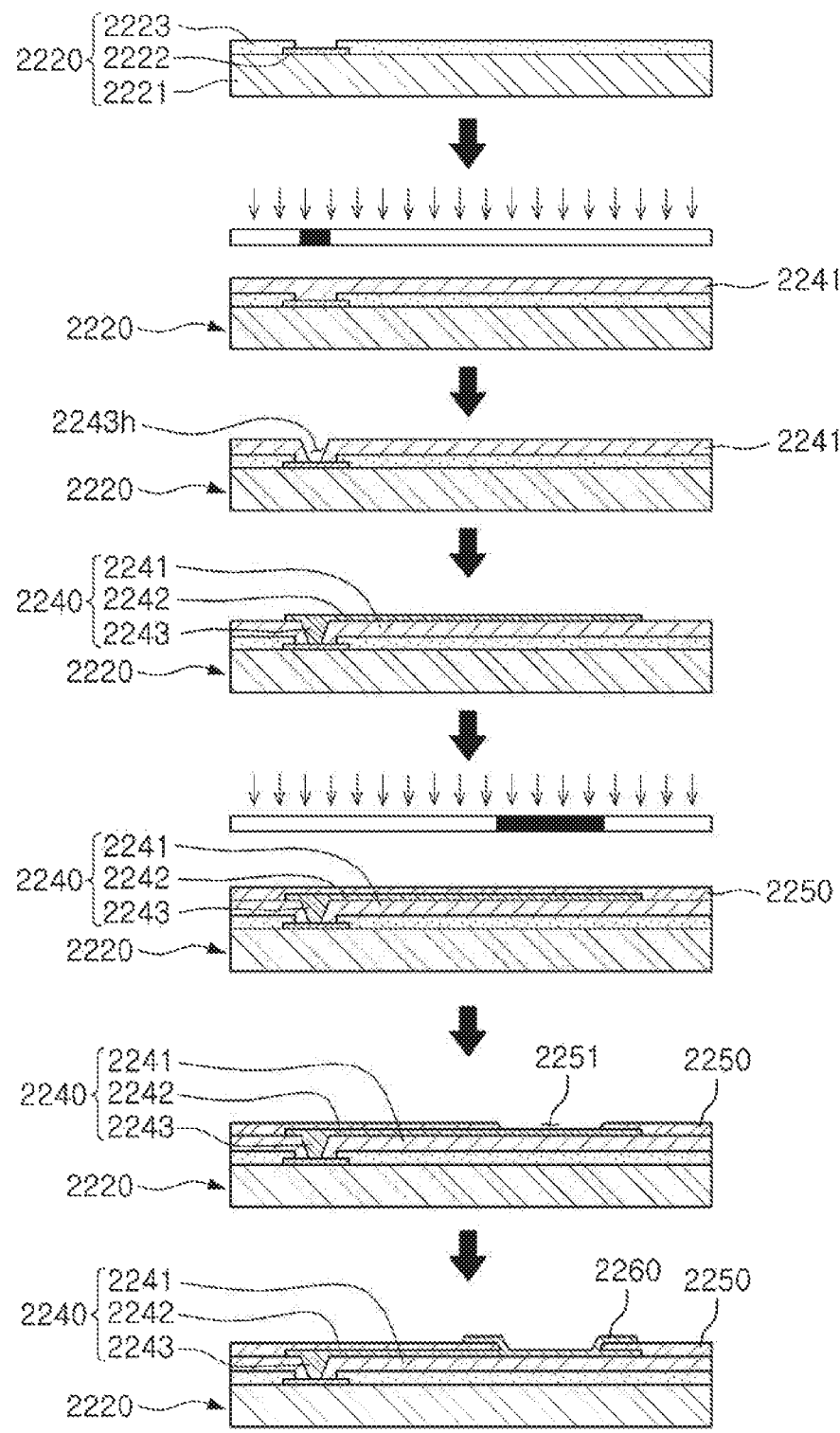
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, an interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation.

Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
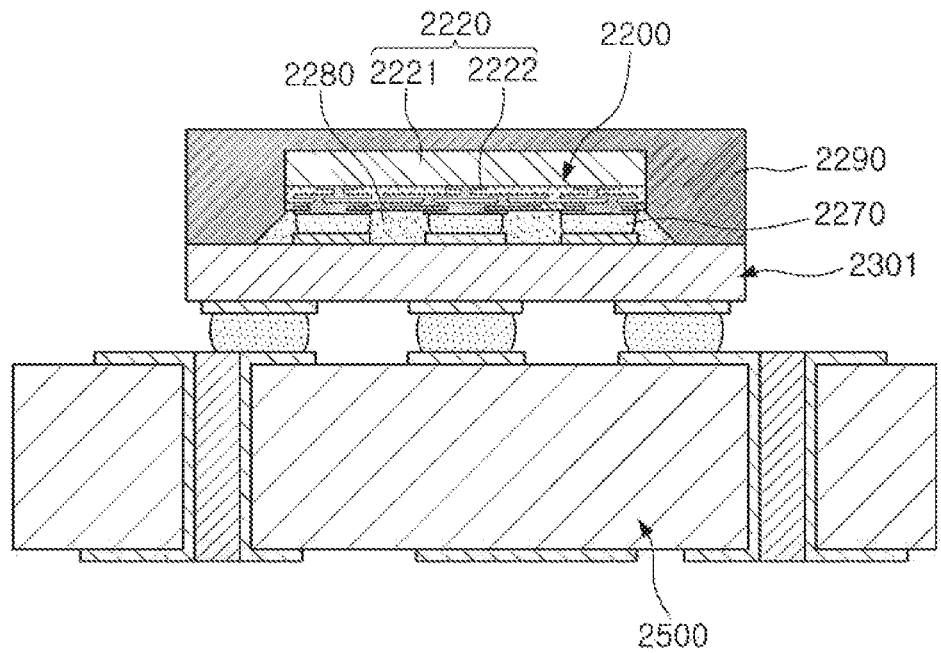
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
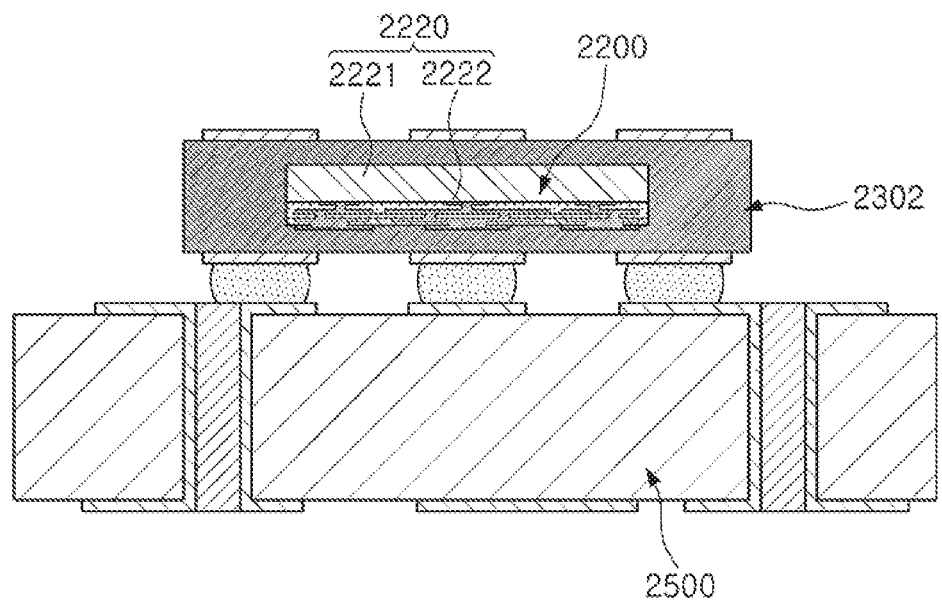
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
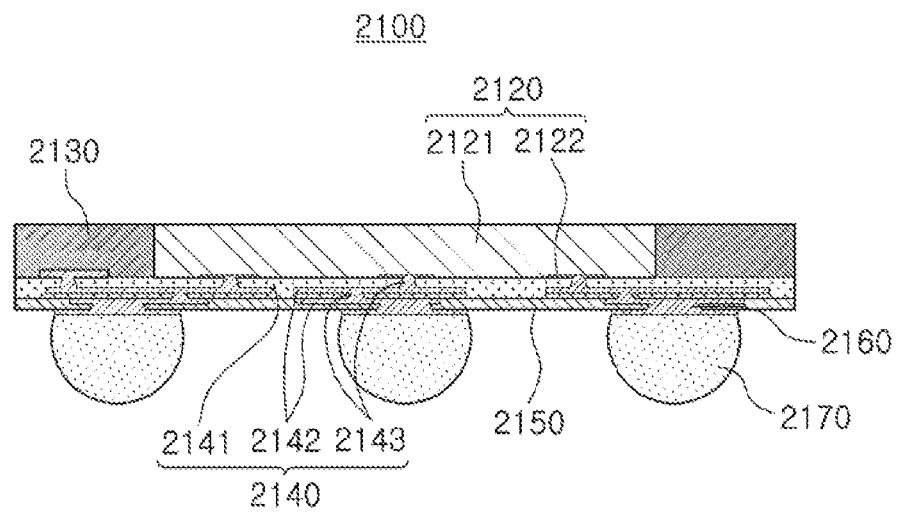
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by an interconnection member 2140. In this case, a passivation layer 2150 may further be formed on the interconnection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced, a standardized ball layout may be used in the fan-out semiconductor package as is, such that the fan-out semiconductor package may be mounted on the main board of the electronic device without using a separate interposer substrate, as described below.

Figure 8:
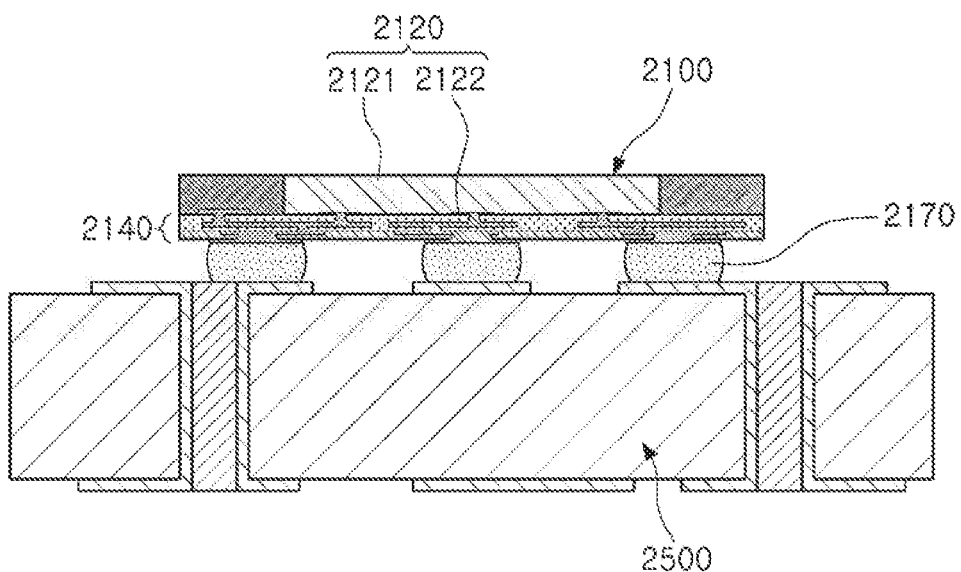
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a bleeding defect due to an encapsulant may be improved will hereinafter be described with reference to the drawings.

Figure 9:
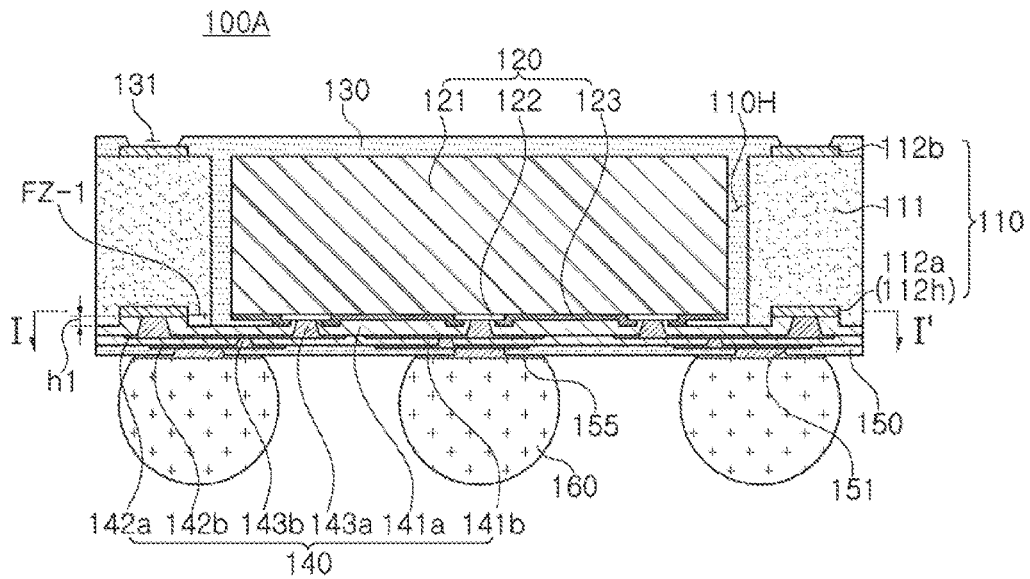
FIG. 9 is a schematic cross-sectional view illustrating an example of a fan-out semiconductor package.

FIG. 9 is a schematic cross-sectional view illustrating an example of a fan-out semiconductor package.

Figure 10:
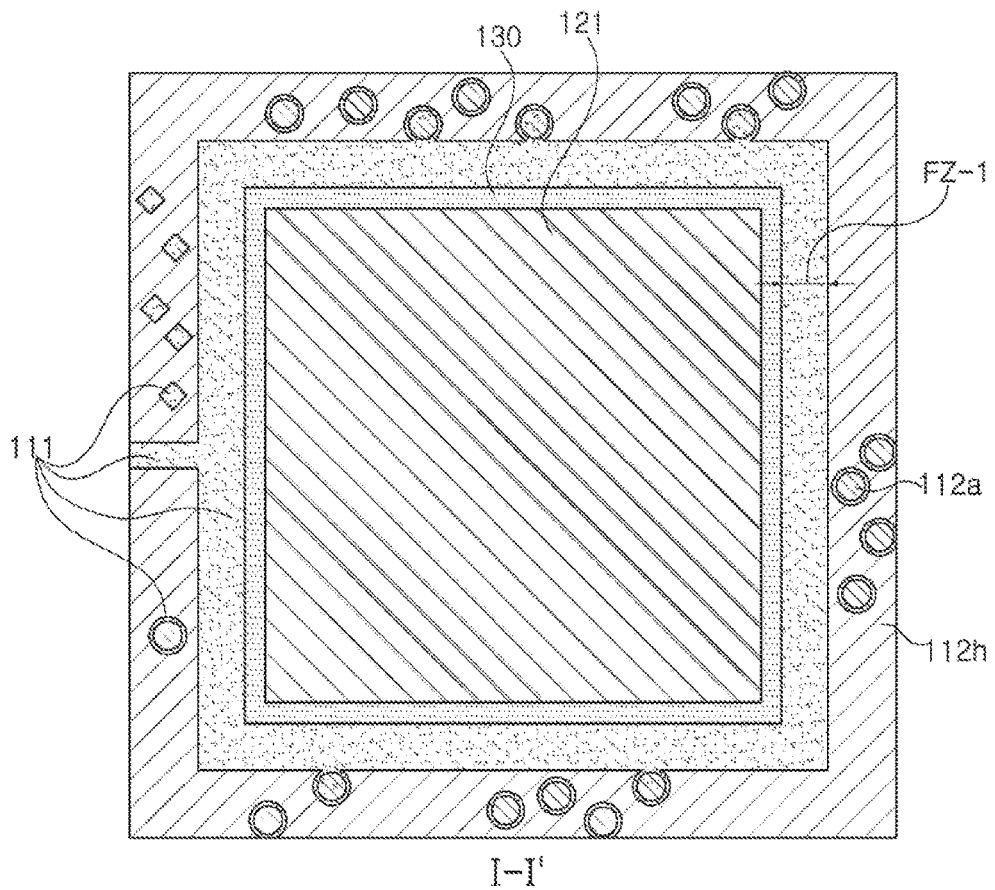
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an under-bump metal layer 160 disposed in openings 151 of the passivation layer 150, and connection terminals 170 disposed on the under-bump metal layer 160. The first interconnection member 110 may include an insulating layer 111 in contact with the second interconnection member 140, a first redistribution layer 112a in contact with the second interconnection member 140, and a blocking layer FZ-1 in contact with the second interconnection member 140 and the encapsulant 130 and surrounding the through-hole 110H. An interface between the blocking layer FZ-1 and the second interconnection member 140 may be disposed on a level h1 different from that of an interface between the first redistribution layer 112a of the first interconnection member 110 and the second interconnection member 140.

Meanwhile, generally, in a fan-out semiconductor package, a semiconductor chip is protected by covering an inactive surface and side surfaces of the semiconductor chip with an encapsulant.

In this case, when a first interconnection member having a through-hole is introduced, an upper surface and side surfaces of the first interconnection member may also be covered with the encapsulant. The encapsulation may be performed by attaching the first interconnection member to an adhesive member, or the like, disposing the semiconductor chip in the through-hole, laminating or applying a material for forming an encapsulant on the adhesive member, and then hardening the material. However, as illustratively illustrated in FIG. 24, an encapsulant 130' may bleed into a redistribution layer 112' formed at a lower portion of a first interconnection member 110' in an encapsulating process to pollute the redistribution layer 112'. In this case, when a second interconnection member is formed in the subsequent process, reliability problems such as an open defect, a connectivity decrease, an electrical short-circuit, and the like, of vias connected to the redistribution layer 112' may occur. In addition, an amount of bleeding of the encapsulant 130' may not be constant, which may cause a secondary problem that uniformity of a thickness of the encapsulant 130' may be low. Meanwhile, this bleeding may also pollute connection pads disposed on a lower surface of the semiconductor chip 120'.

On the other hand, in a case in which the blocking layer FZ-1 surrounding the through-hole 110H, more specifically, continuously surrounding the through-hole 110H, is introduced at a portion of the first interconnection member 110 in contact with the second interconnection member 140, that is, a lower portion of the first interconnection member 110 attached to an adhesive member, or the like, in an encapsulating process, as in the fan-out semiconductor package 100A according to the exemplary embodiment, a material for forming the encapsulant 130 is blocked by the blocking layer FZ-1, such that the material may not bleed into the first distribution layer 112a disposed at a lower portion of the first interconnection member 110. Therefore, the problem as described above may be improved. The blocking layer FZ-1 may be a portion of the insulating layer 111 constituting the first interconnection member 110 as in the exemplary embodiment. That is, the first redistribution layer 112a may be recessed in the insulating layer 111, and a protruding portion of the insulating layer 111 may be used as the blocking layer FZ-1. Therefore, in the exemplary embodiment, the interface between the blocking layer FZ-1 and the second interconnection member 140 may be disposed on the level h1 different from that of the interface between the first redistribution layer 112a of the first interconnection member 110 and the second interconnection member 140. That is, the blocking layer FZ-1 and the first redistribution layer 112a of the first interconnection member 110 may be disposed on different levels.

Meanwhile, at the lower portion of the first interconnection member 110 in contact with the second interconnection member 140, when a region surrounding the through-hole 110H is a first region and a region surrounding the first region is a second region, the blocking layer FZ-1 may be disposed in the first region, and the first redistribution layer 112a may be disposed in the second region. When this disposition form is satisfied, the blocking layer FZ-1 may block the encapsulant 130 bleeding into the lower portion of the first interconnection member 110 through the through-hole 110H. That is, a lower surface of the blocking layer FZ-1 may be in contact with the second interconnection member 140, and a side surface thereof may be in contact with the encapsulant 130. In addition to the first redistribution layer 112a, a metal layer 112h may be further disposed in the second region. The metal layer 112h may be a dummy pattern for increasing a metal ratio in order to suppress warpage, or the like. If necessary, the metal layer 112h may be used as a ground. The first region may have an area greater than that of the second region.

The respective components included in the fan-out semiconductor package 100A according to the exemplary embodiment will hereinafter be described in more detail.

The first interconnection member 110 may maintain rigidity of the fan-out semiconductor package 100A, and serve to secure uniformity of a thickness of the encapsulant 130. In addition, the first interconnection member 110 may include redistribution layers 112a and 112b redistributing the connection pads 122 of the semiconductor chip 120 to thus reduce the number of layers of the second interconnection member 140. The first interconnection member 110 may have the through-hole 110H. The through-hole 110H may have the semiconductor chip 120 disposed therein to be spaced apart from the first interconnection member 110 by a predetermined distance. Side surfaces of the semiconductor chip 120 may be surrounded by the first interconnection member 110. However, such a form is only an example and may be variously modified to have other forms. In addition, the first interconnection member 110 may perform another function depending on a form thereof.

The first interconnection member 110 may include the insulating layer 111 in contact with the second interconnection member 140, the first redistribution layer 112a in contact with the second interconnection member 140 and embedded in the insulating layer 111, and a second redistribution layer 112b disposed on the other surface of the insulating layer 111 opposing one surface of the insulating layer 111 in which the first redistribution layer 112a is embedded. In addition, the first interconnection member 110 may include vias (not illustrated) penetrating through the insulating layer 111 and electrically connecting the first and second redistribution layers 112a and 112b to each other. Since the first redistribution layer 112a is embedded in the insulating layer 111, an insulating distance of an insulating layer 141a of the second interconnection member 140 may be relatively constant. The first redistribution layer 112a may be recessed in the insulating layer, such that a lower surface of the insulating layer 111 may have a step with respect to a lower surface of the first redistribution layer 112a. In this case, the protruding portion of the insulating layer 111 may continuously surround the through-hole 110H to be thus utilized as the blocking layer FZ-1.

A material of the insulating layer 111 is not particularly limited. For example, an insulating material may be used as a material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin may also be used as the insulating material.

The redistribution layers 112a and 112b may serve to redistribute the connection pads 122 of the semiconductor chip 120, and a material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may have various functions, depending on designs of layers corresponding thereto. For example, the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may include a via pad, a connection terminal pad, and the like.

A surface treatment layer (not illustrated) may further be formed on portions of the redistribution layer 112b exposed from the redistribution layers 112a and 112b through openings 131 formed in the encapsulant 130, if necessary. The surface treatment layer (not illustrated) is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias (not illustrated) may electrically connect the redistribution layers 112a and 112b formed on different layers to each other, resulting in an electrical pathway in the first interconnection member 110. A material of each of the vias may be a conductive material such as copper (Cu), aluminum (Al), silver (Ag), tin (Sn), gold (Au), nickel (Ni), lead (Pb), titanium (Ti), or alloys thereof. Each of the vias may be entirely filled with the conductive material, or the conductive material may be formed along a wall of respective via holes. In addition, each of the vias may have all shapes known in the related art, such as a tapered shape, a cylindrical shape, and the like.

The semiconductor chip 120 may be an integrated circuit (IC) provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. Meanwhile, one surface of the semiconductor chip 120 on which the connection pads 122 are formed may be the active surface, and the other surface of the semiconductor chip 120 opposing the active surface may be the inactive surface.

The encapsulant 130 may protect the first interconnection member 110 and/or the semiconductor chip 120. An encapsulation form of the encapsulant 130 is not particularly limited, but may be a form in which the encapsulant 130 surrounds at least portions of the first interconnection member 110 and/or the semiconductor chip 120. For example, the encapsulant 130 may cover upper surfaces of the first interconnection member 110 and the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second interconnection member 140. Meanwhile, the encapsulant 130 may fill the through-hole 110H to thus serve as an adhesive and reduce buckling of the semiconductor chip 120 depending on materials thereof.

The materials of the encapsulant 130 are not particularly limited. For example, an insulating material may be used as the materials of the encapsulant 130. In this case, the insulating material may be a thermosetting resin such as an epoxy resin, a thermoplastic resin such as a polyimide resin, a resin having a reinforcing material such as an inorganic filler impregnated in the thermosetting resin and the thermoplastic resin, for example, ABF, FR-4, BT, a PID resin, or the like. In addition, a known molding material such as an epoxy molding compound (EMC), or the like, may also be used.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 to be described below depending on the functions. The second interconnection member 140 may include insulating layers 141a and 141b, the redistribution layers 142a and 142b disposed on the insulating layers 141a and 141b, and vias 143a and 143b penetrating through the insulating layers 141a and 141b and connecting the redistribution layers 142a and 142b to each other. In the fan-out semiconductor package 100A according to the exemplary embodiment, the second interconnection member 140 may include a plurality of redistribution layers 142a and 142b, but is not limited thereto. That is, the second interconnection member 140 may also include a single layer. In addition, the second interconnection member 140 may also include different numbers of layers.

An insulating material may be used as a material of each of the insulating layers 141a and 141b. In this case, a photosensitive insulating material such as a photoimagable dielectric (PID) resin may also be used as the insulating material. In this case, each of the insulating layers 141a and 141b may be formed to have a smaller thickness, and a fine pitch of each of the vias 143a and 143b may be achieved more easily. Materials of the insulating layers 141a and 141b may be the same as each other or may be different from each other, if necessary. The insulating layers 141a and 141b may be integrated with each other depending on processes, so that a boundary therebetween may not be readily apparent.

The redistribution layers 142a and 142b may serve to substantially redistribute the connection pads 122. A material of each of the redistribution layers 142a and 142b may be a conductive material such as copper (Cu), aluminum (Al), silver (Ag), tin (Sn), gold (Au), nickel (Ni), lead (Pb), titanium (Ti), or alloys thereof. The redistribution layers 142a and 142b may have various functions, depending on designs of layers corresponding thereto. For example, the redistribution layers 142a and 142b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142a and 142b may include a via pad, a connection terminal pad, and the like.

A surface treatment layer (not illustrated) may further be formed on portions of the redistribution layer 142b exposed from the redistribution layers 142a and 142b, if necessary. The surface treatment layer (not illustrated) is not particularly limited as long as it is known in the related art, but may be formed by, for example, electrolytic gold plating, electroless gold plating, OSP or electroless tin plating, electroless silver plating, electroless nickel plating/substituted gold plating, DIG plating, HASL, or the like.

The vias 143a and 143b may electrically connect the redistribution layers 142a and 142b, the connection pads 122, or the like, formed on different layers to each other, resulting in an electrical pathway in the fan-out semiconductor package 100A. A material of each of the vias 143a and 143b may be a conductive material such as copper (Cu), aluminum (Al), silver (Ag), tin (Sn), gold (Au), nickel (Ni), lead (Pb), titanium (Ti), or alloys thereof. Each of the vias 143a and 143b may be entirely filled with the conductive material, or the conductive material may also be formed along a wall of each of the vias. In addition, each of the vias 143a and 143b may have all shapes known in the related art, such as a tapered shape, a cylindrical shape, and the like.

A lower surface of the first redistribution layer 112a of the first interconnection member 110 may be disposed on a level above a lower surface of the connection pad 122 of the semiconductor chip 120. In addition, a distance between the redistribution layer 142a of the second interconnection member 140 and the first redistribution layer 112a of the first interconnection member 110 may be greater than that between the redistribution layer 142a of the second interconnection member 140 and the connection pad 122 of the semiconductor chip 120. Here, the first redistribution layer 112a may be recessed into the insulating layer 111. Thicknesses of the redistribution layers 112a and 112b of the first interconnection member 110 may be greater than those of the redistribution layers 142a and 142b of the second interconnection member 140. Since the first interconnection member 110 may have a thickness equal to or greater than that of the semiconductor chip 120, the redistribution layers 112a and 112b formed in the first interconnection member 110 may be formed to be large depending on a scale of the first interconnection member 110. On the other hand, the redistribution layers 142a and 142b of the second interconnection member 140 may be formed to be relatively small for thinness.

The passivation layer 150 may be additionally configured to protect the second interconnection member 140 from external physical or chemical damage. The passivation layer 150 may have the openings 151 exposing at least portions of one 142b of redistribution layers 142a and 142b of the second interconnection member 140. Each of the openings 151 may expose the entirety or only a portion of a surface of the redistribution layer 142b. A material of the passivation layer 150 is not particularly limited, but may be a photosensitive insulating material such as a PID resin. Alternatively, a solder resist may also be used as a material of the passivation layer 150. Alternatively, an insulating resin that does not include a glass cloth, but has a filler impregnated therein, for example, ABF including an inorganic filler and an epoxy resin, or the like, may be used as the material of the passivation layer 150.

The under-bump metal layer 160 may be additionally configured to improve connection reliability of the connection terminals 170 to improve board level reliability of the fan-out semiconductor package 100A. The under-bump metal layer 160 may be disposed on walls in the openings 151 of the passivation layer 150 and the exposed redistribution layer 142b of the second interconnection member 140. The under-bump metal layer 160 may be formed by a known metallization method using a known conductive material such as a metal.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto. The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

If necessary, a plurality of semiconductor chips (not illustrated) may be disposed in the through-hole 110H of the first interconnection member 110, the number of through-holes 110H of the first interconnection member 110 may be plural (not illustrated) and semiconductor chips (not illustrated) may be disposed in the through-holes, respectively. In addition, separate passive components (not illustrated) such as a condenser, an inductor, and the like, may be encapsulated together with the semiconductor chip in the through-hole 110H. In addition, a surface mounted technology component (not illustrated) may be mounted on the passivation layer 150.

Figure 11:
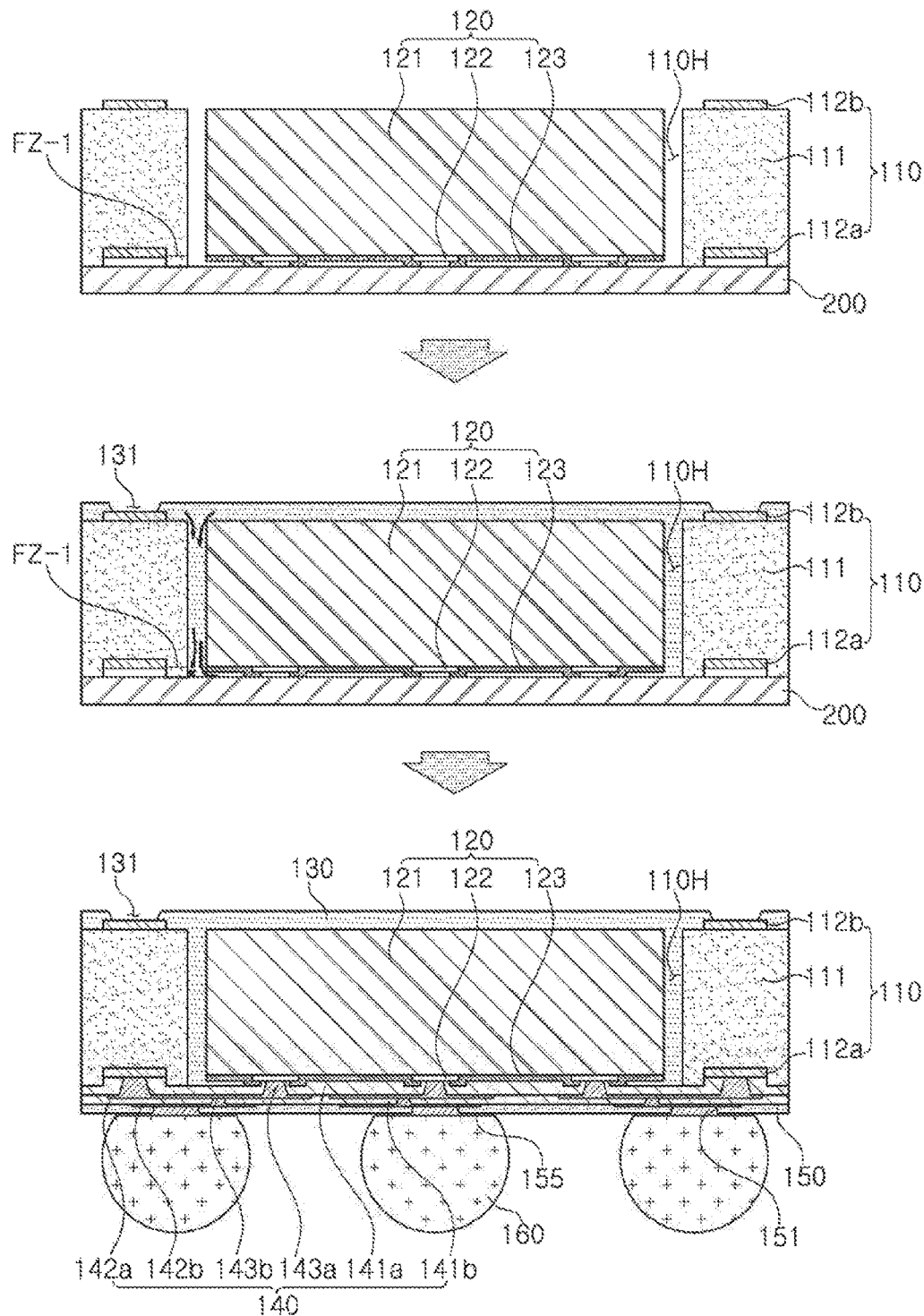
FIG. 11 is schematic views illustrating an example of processes of manufacturing the fan-out semiconductor package of FIG. 9.

FIG. 11 is schematic views illustrating an example of processes of manufacturing the fan-out semiconductor package of FIG. 9.

Referring to the drawing, the first interconnection member 110 may be first manufactured. The first interconnection member 110 may be manufactured by forming the first redistribution layers 112a, the metal layers 112h, and the like, on opposite surfaces of a carrier film having metal films formed on the opposite surfaces thereof, forming the insulating layers 111 covering the first redistribution layers 112a, the metal layers 112h, and the like, forming the vias (not illustrated) penetrating through the insulating layers 111 and the second redistribution layers 112b disposed on the insulating layers 111, separating the insulating layers 111, the redistribution layers 112a and 112b, and the like, formed on the opposite surfaces of the carrier film from the carrier film, and then forming the through-hole 110H penetrating through the insulating layer 111. The redistribution layers 112a and 112b and the vias (not illustrated) may be formed by a known plating process. The insulating layer 111 may be formed by a known lamination method or applying method. The through-hole 110H may be formed using a laser drilling and/or a mechanical drilling method. Then, the first interconnection member 110 may be attached to a support 200 such as an adhesive member, or the like, and the semiconductor chip 120 may be attached to the support 200 to be disposed in a face-down form in the through-hole 110H of the first interconnection member 110.

Then, at least portions of the first interconnection member 110 and the semiconductor chip 120 may be encapsulated with the encapsulant 130. A material for forming the encapsulant 130 may cover the upper surface of the first interconnection member 110 and the upper surface of the semiconductor chip 120, and be then filled in the through-hole 110H. In this case, when the first interconnection member 110 has the blocking layer FZ-1 continuously surrounding the through-hole 110H as in the exemplary embodiment, a phenomenon in which the material for forming the encapsulant 130 bleeds into the first redistribution layer 112a may be prevented. The encapsulant 130 may be formed by forming the material for forming the encapsulant 130 by a known lamination method or applying method and then hardening the material.

Then, the support 200 may be removed, and the second interconnection member 140 may be formed in a region in which the support 200 is removed. The second interconnection member 140 may be formed by sequentially forming the insulating layers 141a and 141b and then forming the redistribution layers 142a and 142b and the vias 143a and 143b on and in the insulating layers 141a and 141b, respectively. Then, the passivation layer 150 may be formed on the second interconnection member 140, the openings 151 may be formed in the passivation layer 150, and the under-bump metal layer 160 may be formed in the openings 151 by a known metallization method. Then, the connection terminals 170 may be formed on the under-bump metal layer 160. A method of forming the connection terminals 170 is not particularly limited. That is, the connection terminals 170 may be formed by the method well-known in the related art depending on their structures or forms. The connection terminals 170 may be fixed by reflow, and portions of the connection terminals 170 may be embedded in the passivation layer 150 in order to enhance fixing force, and the remaining portions of the connection terminals 170 may be externally exposed, such that reliability may be improved. If necessary, the openings 131 exposing the second redistribution layer 112b of the first interconnection member 110 may be formed in order to be used for marking, connection of a package-on-package (POP), mounting of a surface mount technology (SMT) component, and the like.

Meanwhile, a series of processes may be processes of preparing the carrier film having a large size, manufacturing a plurality of fan-out semiconductor packages 100A through the abovementioned process, and then singulating the plurality of fan-out semiconductor packages into individual fan-out semiconductor packages 100A through a cutting process in order to facilitate mass production. In this case, productivity may be excellent.

Figure 12:
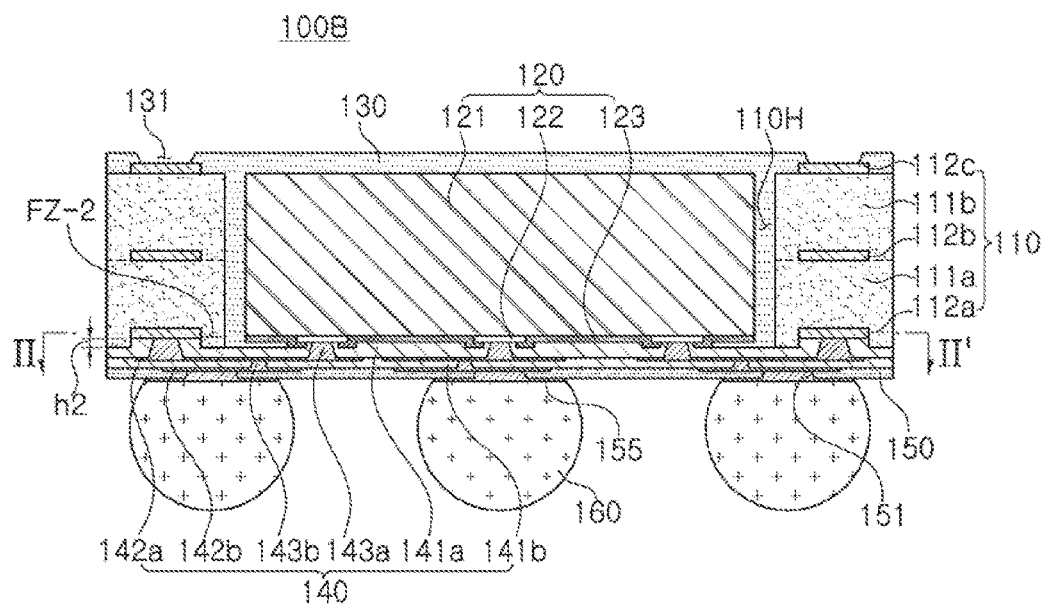
FIG. 12 is a schematic cross-sectional view illustrating another example of a fan-out semiconductor package.

FIG. 12 is a schematic cross-sectional view illustrating another example of a fan-out semiconductor package.

Figure 13:
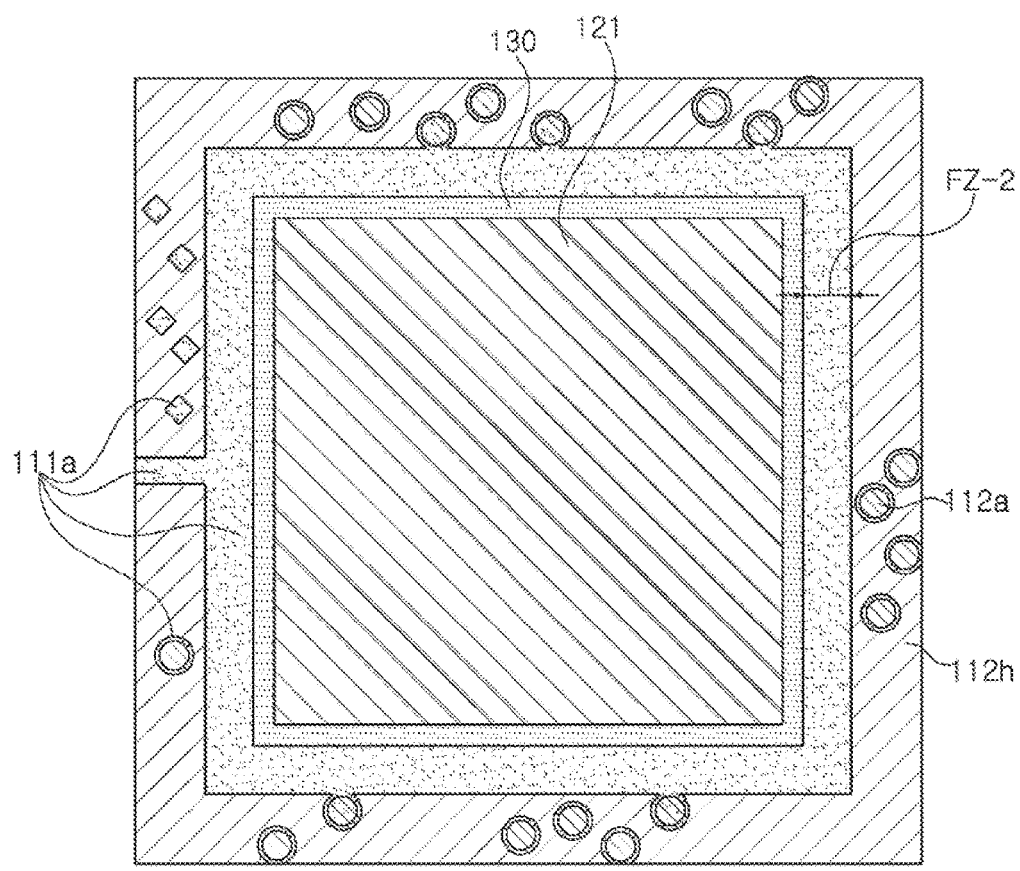
FIG. 13 is a schematic plan view taken along line II-II' of the fan-out semiconductor package of FIG. 12.

FIG. 13 is a schematic plan view taken along line II-II' of the fan-out semiconductor package of FIG. 12.

Referring to the drawings, a fan-out semiconductor package 100B according to another exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an under-bump metal layer 160 disposed in openings 151 of the passivation layer 150, and connection terminals 170 disposed on the under-bump metal layer 160. The first interconnection member 110 may include a first insulating layer 111a in contact with the second interconnection member 140, a first redistribution layer 112a in contact with the second interconnection member 140, and a blocking layer FZ-2 in contact with the second interconnection member 140 and the encapsulant 130 and surrounding the through-hole 110H.

An interface between the blocking layer FZ-2 and the second interconnection member 140 may be disposed on a level h2 different from that of an interface between the first redistribution layer 112a of the first interconnection member 110 and the second interconnection member 140.

In a case in which the blocking layer FZ-2 surrounding the through-hole 110H, more specifically, continuously surrounding the through-hole 110H, is introduced at a portion of the first interconnection member 110 in contact with the second interconnection member 140, that is, a lower portion of the first interconnection member 110 attached to an adhesive member, or the like, in an encapsulating process, as in the fan-out semiconductor package 100B according to another exemplary embodiment, a material for forming the encapsulant 130 is blocked by the blocking layer FZ-2, such that the material may not bleed into the first distribution layer 112a disposed at a lower portion of the first interconnection member 110. Therefore, the problem as described above may be improved. The blocking layer FZ-2 may be a portion of the first insulating layer 111a constituting the first interconnection member 110 as in the exemplary embodiment. That is, the first redistribution layer 112a may be recessed in the first insulating layer 111a, and a protruding portion of the first insulating layer 111a may be used as the blocking layer FZ-2. Therefore, in another exemplary embodiment, the interface between the blocking layer FZ-2 and the second interconnection member 140 may be disposed on the level h2 different from that of the interface between the first redistribution layer 112a of the first interconnection member 110 and the second interconnection member 140. That is, the blocking layer FZ-2 and the first redistribution layer 112a of the first interconnection member 110 may be disposed on different levels.

At the lower portion of the first interconnection member 110 in contact with the second interconnection member 140, when a region surrounding the through-hole 110H is a first region and a region surrounding the first region is a second region, the blocking layer FZ-2 may be disposed in the first region, and the first redistribution layer 112a may be disposed in the second region. When this disposition form is satisfied, the blocking layer FZ-2 may block the encapsulant 130 bleeding into the lower portion of the first interconnection member 110 through the through-hole 110H. That is, a lower surface of the blocking layer FZ-2 may be in contact with the second interconnection member 140, and a side surface thereof may be in contact with the encapsulant 130. In addition to the first redistribution layer 112a, a metal layer 112h may be further disposed in the second region. The metal layer 112h may be a dummy pattern for increasing a metal ratio in order to suppress warpage, or the like. If necessary, the metal layer 112h may be used as a ground. The first region may have an area greater than that of the second region.

The first interconnection member 110 may include the first insulating layer 111a in contact with the second interconnection member 140, the first redistribution layer 112a in contact with the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. Since the first interconnection member 110 may include a larger number of redistribution layers 112a, 112b, and 112c, the second interconnection member 140 may be further simplified. Therefore, a decrease in a yield depending on a defect occurring in a process of forming the second interconnection member 140 may be improved. Meanwhile, although not illustrated in the drawing, the first to third redistribution layers 112a, 112b, and 112c may be electrically connected to each other by vias (not illustrated) penetrating through the first and second insulating layers 111a and 111b.

A lower surface of the first redistribution layer 112a of the first interconnection member 110 may be disposed on a level above a lower surface of the connection pad 122 of the semiconductor chip 120. In addition, a distance between a redistribution layer 142a of the second interconnection member 140 and the first redistribution layer 112a of the first interconnection member 110 may be greater than that between the redistribution layer 142a of the second interconnection member 140 and the connection pad 122 of the semiconductor chip 120. Here, the first redistribution layer 112a may be recessed into the first insulating layer 111a. The second redistribution layer 112b of the first interconnection member 110 may be disposed on a level between the active surface and the inactive surface of the semiconductor chip 120. The first interconnection member 110 may be formed at have a thickness corresponding to that of the semiconductor chip 120. Therefore, the second redistribution layer 112b formed in the first interconnection member 110 may be disposed on a level between the active surface and the inactive surface of the semiconductor chip 120. Thicknesses of the redistribution layers 112a, 112b, and 112c of the first interconnection member 110 may be greater than those of the redistribution layers 142a and 142b of the second interconnection member 140. Since the first interconnection member 110 may have a thickness equal to or greater than that of the semiconductor chip 120, the redistribution layers 112a, 112b, and 112c may be formed to be large, depending on a scale of the first interconnection member 110. On the other hand, the redistribution layers 142a and 142b of the second interconnection member 140 may be formed to be relatively small for thinness.

A description, or the like, of other configurations and a manufacturing method except for the abovementioned configuration overlaps that described above, and is thus omitted.

Figure 14:
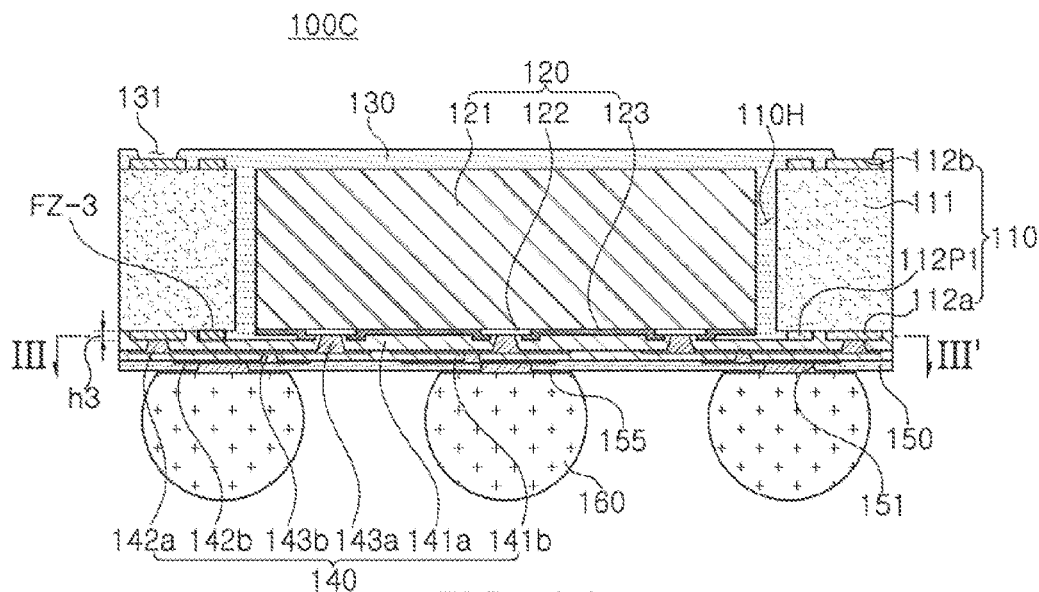
FIG. 14 is a schematic cross-sectional view illustrating another example of a fan-out semiconductor package.

FIG. 14 is a schematic cross-sectional view illustrating another example of a fan-out semiconductor package.

Figure 15:
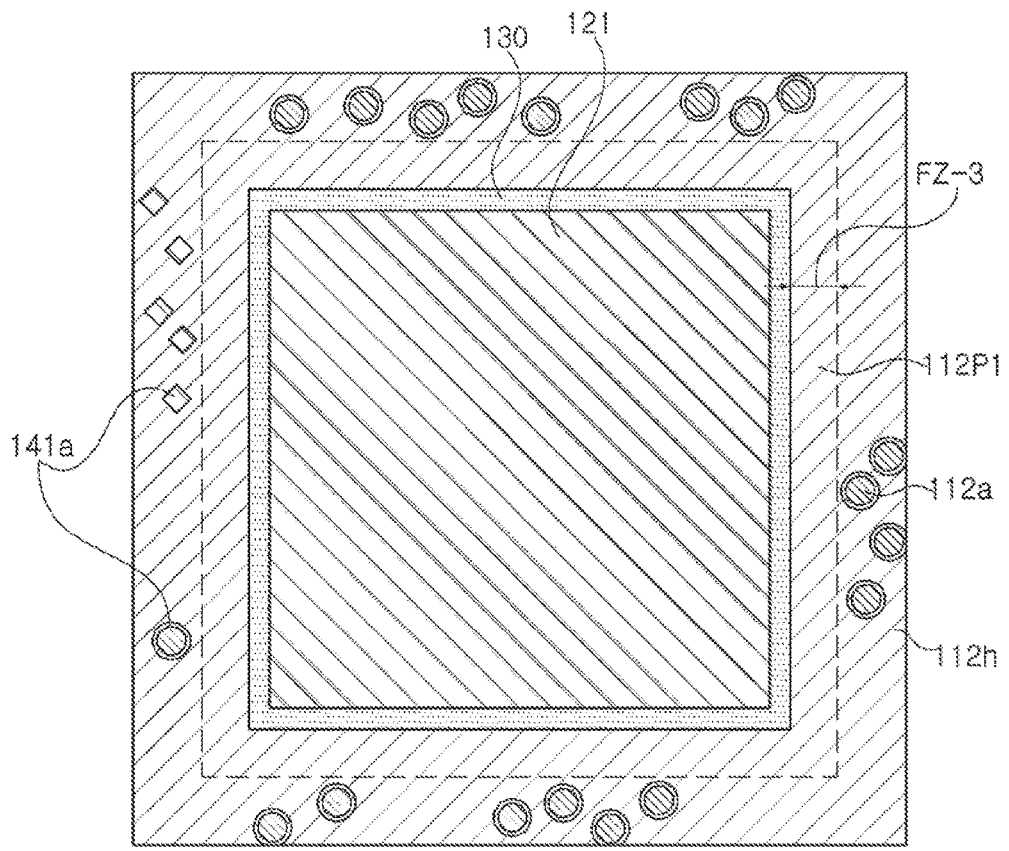
FIG. 15 is a schematic plan view taken along line of the fan-out semiconductor package of FIG. 14.

FIG. 15 is a schematic plan view taken along line of the fan-out semiconductor package of FIG. 14.

Referring to the drawings, a fan-out semiconductor package 100C according to another exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an under-bump metal layer 160 disposed in openings 151 of the passivation layer 150, and connection terminals 170 disposed on the under-bump metal layer 160. The first interconnection member 110 may include an insulating layer 111 in contact with the second interconnection member 140, a first redistribution layer 112a in contact with the second interconnection member 140, and a blocking layer FZ-3 in contact with the second interconnection member 140 and the encapsulant 130 and surrounding the through-hole 110H. An interface between the blocking layer FZ-3 and the second interconnection member 140 may be disposed on a level h3 different from that of an interface between the insulating layer 111 of the first interconnection member 110 and the second interconnection member 140.

In a case in which the blocking layer FZ-3 surrounding the through-hole 110H, more specifically, continuously surrounding the through-hole 110H, is introduced at a portion of the first interconnection member 110 in contact with the second interconnection member 140, that is, a lower portion of the first interconnection member 110 attached to an adhesive member, or the like, in an encapsulating process, as in the fan-out semiconductor package 100C according to another exemplary embodiment, a material for forming the encapsulant 130 is blocked by the blocking layer FZ-3, such that the material may not bleed into the first distribution layer 112a disposed at a lower portion of the first interconnection member 110. Therefore, the problem as described above may be improved. The blocking layer FZ-3 may be a plating layer 112P1 formed on the insulating layer 111. That is, the plating layer 112P1 continuously surrounding the through-hole 110H may be formed separately from the first redistribution layer 112a on the insulating layer 111 to be thus used as the blocking layer FZ-3. Therefore, in another exemplary embodiment, the interface between the blocking layer FZ-3 and the second interconnection member 140 may be disposed on the level h3 different from that of the interface between the insulating layer 111 of the first interconnection member 110 and the second interconnection member 140. That is, the blocking layer FZ-3 and the first redistribution layer 112a of the first interconnection member 110 may be disposed on the same level.

Meanwhile, at the lower portion of the first interconnection member 110 in contact with the second interconnection member 140, when a region surrounding the through-hole 110H is a first region and a region surrounding the first region is a second region, the blocking layer FZ-3 may be disposed in the first region, and the first redistribution layer 112a may be disposed in the second region. When this disposition form is satisfied, the blocking layer FZ-3 may block the encapsulant 130 bleeding into the lower portion of the first interconnection member 110 through the through-hole 110H. That is, a lower surface of the blocking layer FZ-3 may be in contact with the second interconnection member 140, and a side surface thereof may be in contact with the encapsulant 130. In addition to the first redistribution layer 112a, a metal layer 112h may be further disposed in the second region. The metal layer 112h may be a dummy pattern for increasing a metal ratio in order to suppress warpage, or the like. If necessary, the metal layer 112h may be used as a ground. The metal layer 112h may be connected to the plating layer 112P1 or be disconnected from the plating layer 112P1, depending on its function. The first region may have an area greater than that of the second region.

The respective components included in the fan-out semiconductor package 100C according to another exemplary embodiment will hereinafter be described in more detail, but a description of contents overlapping those described above will be omitted.

The first interconnection member 110 may include the insulating layer 111, the first redistribution layer 112a in contact with the second interconnection member 140 and disposed on the insulating layer 111, and a second redistribution layer 112b disposed on the other surface of the insulating layer 111 opposing one surface of the insulating layer 111 on which the first redistribution layer 112a is disposed. In addition, the first interconnection member 110 may include vias (not illustrated) penetrating through the insulating layer 111 and electrically connecting the first and second redistribution layers 112a and 112b to each other. The first interconnection member 110 may include the plating layer 112P1 disposed at the same level as that of the first redistribution layer 112a, and the plating layer 112P1 may continuously surround the through-hole 110H to be thus utilized as the blocking layer FZ-3.

The plating layer 112P1 used as the blocking layer FZ-3 may include a conductive material such as copper (Cu), aluminum (Al), silver (Ag), tin (Sn), gold (Au), nickel (Ni), lead (Pb), titanium (Ti), or alloys thereof. The plating layer 112P1 may be formed together with the first redistribution layer 112a when the first redistribution layer 112a is formed. The plating layer 112P1 may have a thickness equal to or greater than that of the first redistribution layer 112a, and in a case in which the plating layer 112P1 has a thickness smaller than that of the first redistribution layer 112a, the encapsulant 130 may bleed into a gap between plating layer 112P1 and the first redistribution layer 112a, such that the plating layer 112P1 may not appropriately serve as the blocking layer FZ-3.

Figure 16:
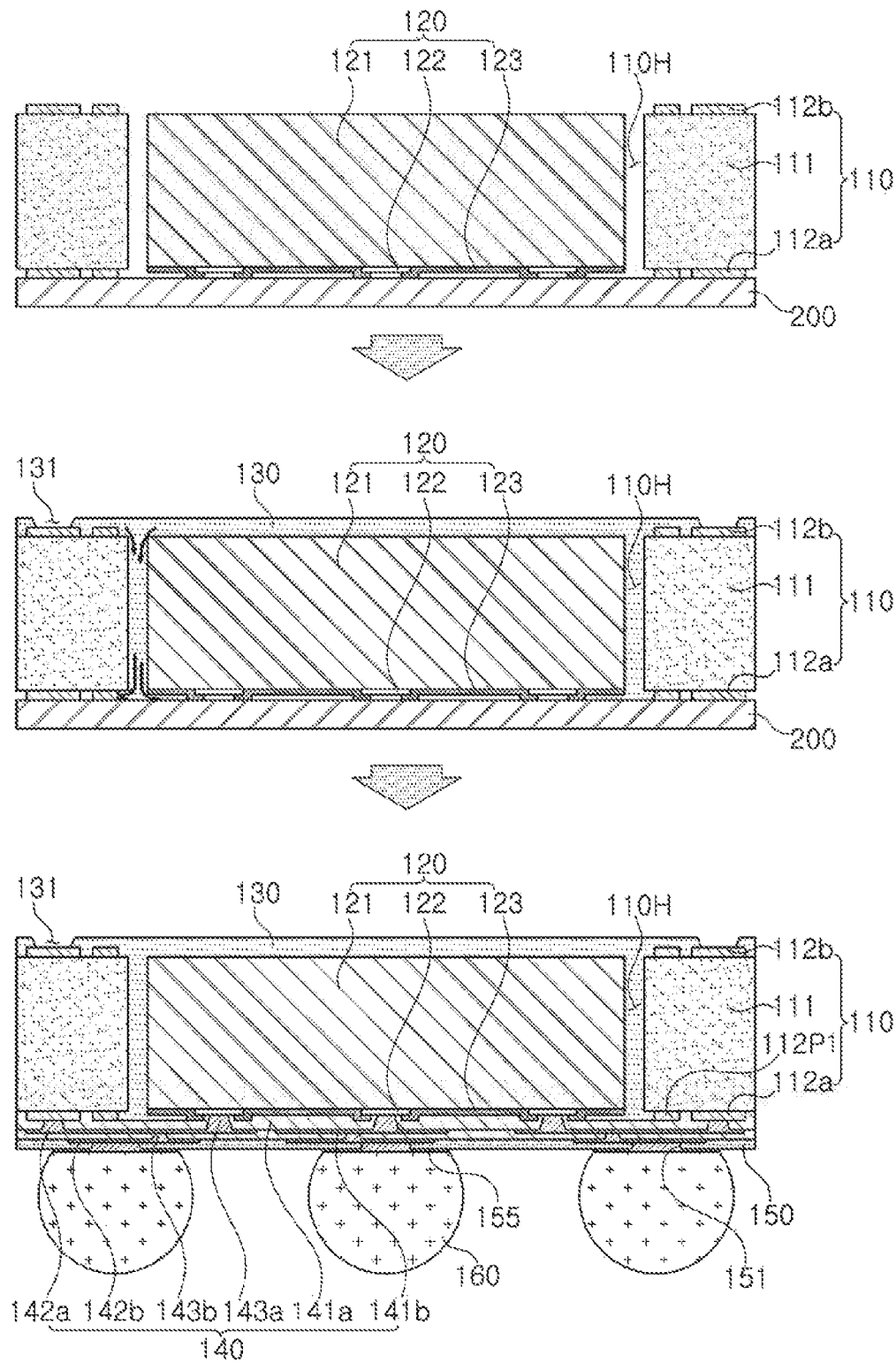
FIG. 16 is schematic views illustrating an example of processes of manufacturing the fan-out semiconductor package of FIG. 14.

FIG. 16 is schematic views illustrating an example of processes of manufacturing the fan-out semiconductor package of FIG. 14.

Referring to the drawing, the first interconnection member 110 may first be manufactured. The first interconnection member 110 may be manufactured by preparing the insulating layer 111, forming the first redistribution layer 112a, the second redistribution layer 112b, the metal layer 112h, the plating layer 112P1, the vias (not illustrated), and the like, on or in the insulating layer 111 using a tenting method, or the like, and forming the through-hole 110H penetrating through the insulating layer 111 using laser or mechanical drilling. Then, the first interconnection member 110 may be attached to a support 200 and the semiconductor chip 120 may be attached to the support 200 to be disposed in a face-down form in the through-hole 110H of the first interconnection member 110.

Then, at least portions of the first interconnection member 110 and the semiconductor chip 120 may be encapsulated with the encapsulant 130. A material for forming the encapsulant 130 may cover an upper surface of the first interconnection member 110 and an upper surface of the semiconductor chip 120, and be then filled in the through-hole 110H. In this case, when the first interconnection member 110 has the plating layer 112P1 continuously surrounding the through-hole 110H as in another exemplary embodiment, a phenomenon in which the material for forming the encapsulant 130 bleeds into the first redistribution layer 112a may be prevented. The encapsulant 130 may be formed by forming the material for forming the encapsulant 130 by a known lamination method or applying method and then hardening the material.

Then, the support 200 may be removed, and the second interconnection member 140 may be formed in a region in which the support 200 is removed. The second interconnection member 140 may be formed by sequentially forming the insulating layers 141a and 141b and then forming the redistribution layers 142a and 142b and the vias 143a and 143b on and in the insulating layers 141a and 141b, respectively. Then, the openings 151 of the passivation layer may be formed, and the under-bump metal layer 160 may be formed in the openings 151 by a known metallization method. Then, the connection terminals 170 may be formed on the under-bump metal layer 160. A method of forming the connection terminals 170 is not particularly limited. That is, the connection terminals 170 may be formed by the method well-known in the related art depending on their structures or forms. The connection terminals 170 may be fixed by reflow, and portions of the connection terminals 170 may be embedded in the passivation layer 150 in order to enhance fixing force, and the remaining portions of the connection terminals 170 may be externally exposed, such that reliability may be improved. If necessary, the openings 131 exposing the second redistribution layer 112b of the first interconnection member 110 may be formed in order to be used for marking, connection of a package-on-package (POP), mounting of a surface mount technology (SMT) component, and the like.

Meanwhile, a series of processes may be processes of preparing the insulating layer 111 having a large size, manufacturing a plurality of fan-out semiconductor packages 100C through the abovementioned process, and then singulating the plurality of fan-out semiconductor packages into individual fan-out semiconductor packages 100C through a cutting process in order to facilitate mass production. In this case, productivity may be excellent.

Figure 17:
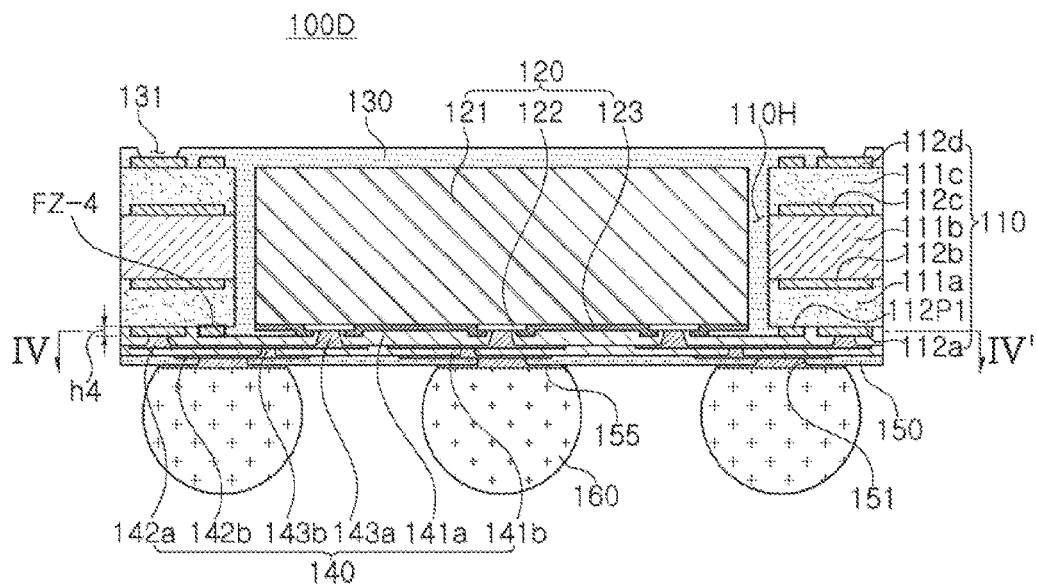
FIG. 17 is a schematic cross-sectional view illustrating another example of a fan-out semiconductor package.

FIG. 17 is a schematic cross-sectional view illustrating another example of a fan-out semiconductor package.

Figure 18:
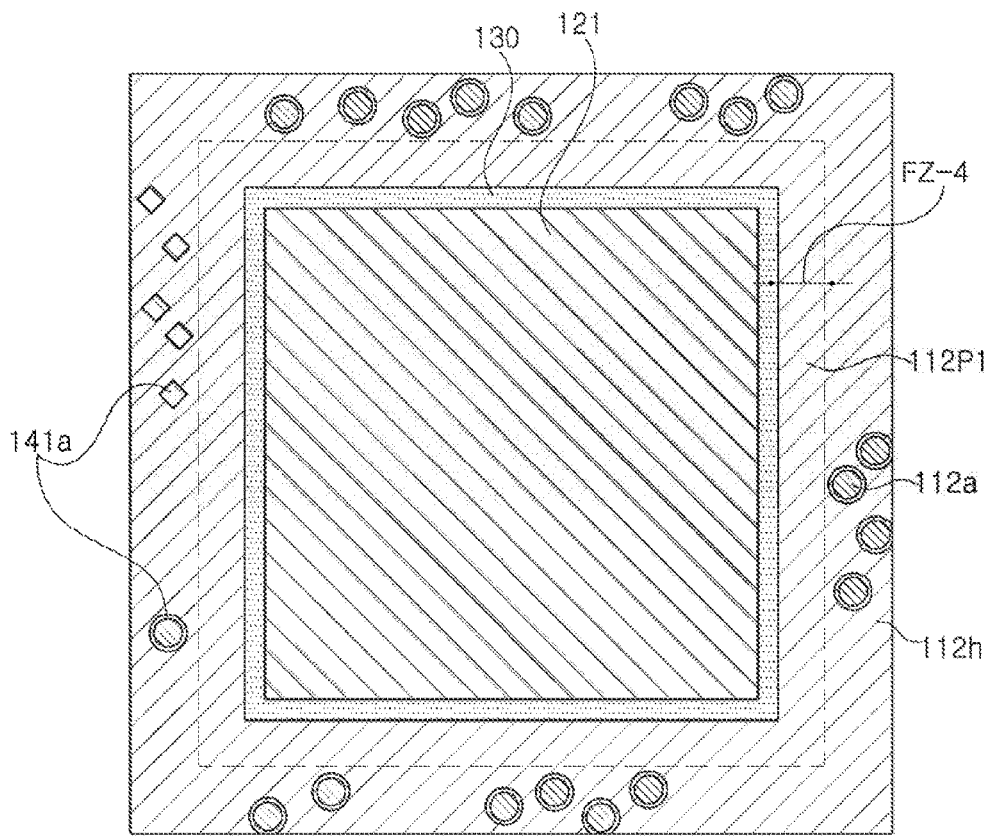
FIG. 18 is a schematic plan view taken along line IV-IV' of the fan-out semiconductor package of FIG. 17.

FIG. 18 is a schematic plan view taken along line IV-IV' of the fan-out semiconductor package of FIG. 17.

Referring to the drawings, a fan-out semiconductor package 100D according to another exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an under-bump metal layer 160 disposed in openings 151 of the passivation layer 150, and connection terminals 170 disposed on the under-bump metal layer 160. The first interconnection member 110 may include a first insulating layer 111a in contact with the second interconnection member 140, a first redistribution layer 112a in contact with the second interconnection member 140, and a blocking layer FZ-4 in contact with the second interconnection member 140 and the encapsulant 130 and surrounding the through-hole 110H. An interface between the blocking layer FZ-4 and the second interconnection member 140 may be disposed on a level h4 different from that of an interface between the first insulating layer 111a of the first interconnection member 110 and the second interconnection member 140.

In a case in which the blocking layer FZ-4 surrounding the through-hole 110H, more specifically, continuously surrounding the through-hole 110H, is introduced at a portion of the first interconnection member 110 in contact with the second interconnection member 140, that is, a lower portion of the first interconnection member 110 attached to an adhesive member, or the like, in an encapsulating process, as in the fan-out semiconductor package 100C according to another exemplary embodiment, a material for forming the encapsulant 130 is blocked by the blocking layer FZ-4, such that the material may not bleed into the first distribution layer 112a disposed at a lower portion of the first interconnection member 110. Therefore, the problem as described above may be improved. The blocking layer FZ-4 may be a plating layer 112P1 formed on the first insulating layer 111a. That is, the plating layer 112P1 continuously surrounding the through-hole 110H may be formed separately from the first redistribution layer 112a on the first insulating layer 111a to be thus used as the blocking layer FZ-4. Therefore, in another exemplary embodiment, the interface between the blocking layer FZ-4 and the second interconnection member 140 may be disposed on the level h4 different from that of the interface between the first insulating layer 111a of the first interconnection member 110 and the second interconnection member 140. That is, the blocking layer FZ-4 and the first redistribution layer 112a of the first interconnection member 110 may be disposed on the same level. The plating layer 112P1 may have a thickness equal to or greater than that of the first redistribution layer 112a.

At the lower portion of the first interconnection member 110 in contact with the second interconnection member 140, when a region surrounding the through-hole 110H is a first region and a region surrounding the first region is a second region, the blocking layer FZ-4 may be disposed in the first region, and the first redistribution layer 112a may be disposed in the second region. When this disposition form is satisfied, the blocking layer FZ-4 may block the encapsulant 130 bleeding into the lower portion of the first interconnection member 110 through the through-hole 110H. That is, a lower surface of the blocking layer FZ-4 may be in contact with the second interconnection member 140, and a side surface thereof may be in contact with the encapsulant 130. In addition to the first redistribution layer 112a, a metal layer 112h may be further disposed in the second region. The metal layer 112h may be a dummy pattern for increasing a metal ratio in order to suppress warpage, or the like. If necessary, the metal layer 112h may be used as a ground. The metal layer 112h may be connected to the plating layer 112P1 or be disconnected from the plating layer 112P1, depending on its function. The first region may have an area greater than that of the second region.

The first interconnection member 110 may include a second insulating layer 111b, a second redistribution layer 112b and a third redistribution layer 112c disposed on opposite surfaces of the second insulating layer 111b, respectively, the first insulating layer 111a disposed on the second insulating layer 111b and covering the second redistribution layer 112b, the first redistribution layer 112a disposed on the first insulating layer 111a, a third insulating layer 111c disposed on the second insulating layer 111b and covering the third redistribution layer 112c, and a fourth redistribution layer 112d disposed on the third insulating layer 111c. Since the first interconnection member 110 may include a larger number of redistribution layers 112a, 112b, 112c, and 112d, the second interconnection member 140 may be further simplified. Therefore, a decrease in a yield depending on a defect occurring in a process of forming the second interconnection member 140 may be improved. Meanwhile, although not illustrated in the drawing, the first to fourth redistribution layers 112a, 112b, 112c, and 112d may be electrically connected to each other by vias (not illustrated) penetrating through the first to third insulating layers 111a, 111b, and 111c.

The second insulating layer 111b may have a thickness greater than those of the first insulating layer 111a and the third insulating layer 111c. The second insulating layer 111b may be relatively thick in order to basically maintain rigidity, and the first insulating layer 111a and the third insulating layer 111c may be introduced in order to form a larger number of redistribution layers 112a and 112d. The second insulating layer 111b may include an insulating material different from those of the first insulating layer 111a and the third insulating layer 111c. For example, the second insulating layer 111b may be formed of, for example, prepreg including a core material, an inorganic filler, and an insulating resin, and the first insulating layer 111a and the third insulating layer 111c may be formed of an ABF or a photosensitive insulating film including an inorganic filler and an insulating resin. However, materials of the first to third insulating layers 111a, 111b, and 111c are not necessarily limited thereto.

A lower surface of the first redistribution layer 112a of the first interconnection member 110 may be disposed on a level below a lower surface of the connection pad 122 of the semiconductor chip 120. In addition, a distance between a redistribution layer 142a of the second interconnection member 140 and the first redistribution layer 112a of the first interconnection member 110 may be smaller than that between the redistribution layer 142a of the second interconnection member 140 and the connection pad 122 of the semiconductor chip 120. Here, the first redistribution layer 112a may be disposed in a protruding form on the first insulating layer 111a, resulting in contact with the second interconnection member 140. The second redistribution layer 112b and the third redistribution layer 112c of the first interconnection member 110 may be disposed on a level between the active surface and the inactive surface of the semiconductor chip 120. The first interconnection member 110 may be formed at have a thickness corresponding to that of the semiconductor chip 120. Therefore, the second redistribution layer 112b and the third redistribution layer 112c formed in the first interconnection member 110 may be disposed on the level between the active surface and the inactive surface of the semiconductor chip 120. Thicknesses of the redistribution layers 112a, 112b, 112c, and 112d of the first interconnection member 110 may be greater than those of the redistribution layers 142a and 142b of the second interconnection member 140. Since the first interconnection member 110 may have a thickness equal to or greater than that of the semiconductor chip 120, the redistribution layers 112a, 112b, 112c, and 112d may also be formed to have large sizes. On the other hand, the redistribution layers 142a and 142b of the second interconnection member 140 may be formed to be relatively small for thinness.

A description of configurations other than the abovementioned configuration and a method for manufacturing the fan-out semiconductor package 100D overlaps that described above in the fan-out semiconductor package 100A and the fan-out semiconductor package 100C, and is thus omitted.

Figure 19:
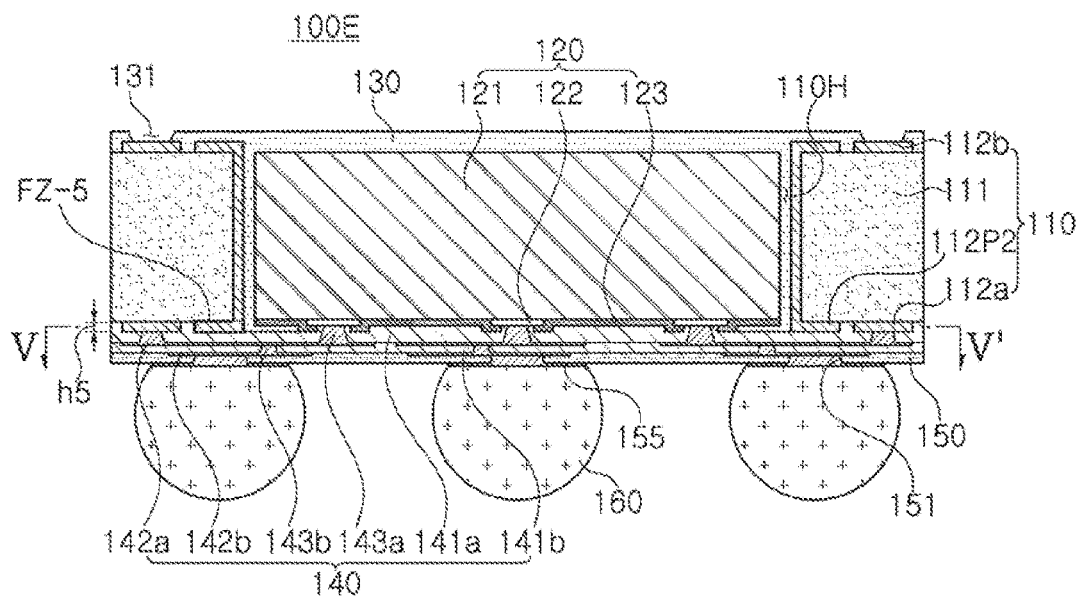
FIG. 19 is a schematic cross-sectional view illustrating another example of a fan-out semiconductor package.

FIG. 19 is a schematic cross-sectional view illustrating another example of a fan-out semiconductor package.

Figure 20:
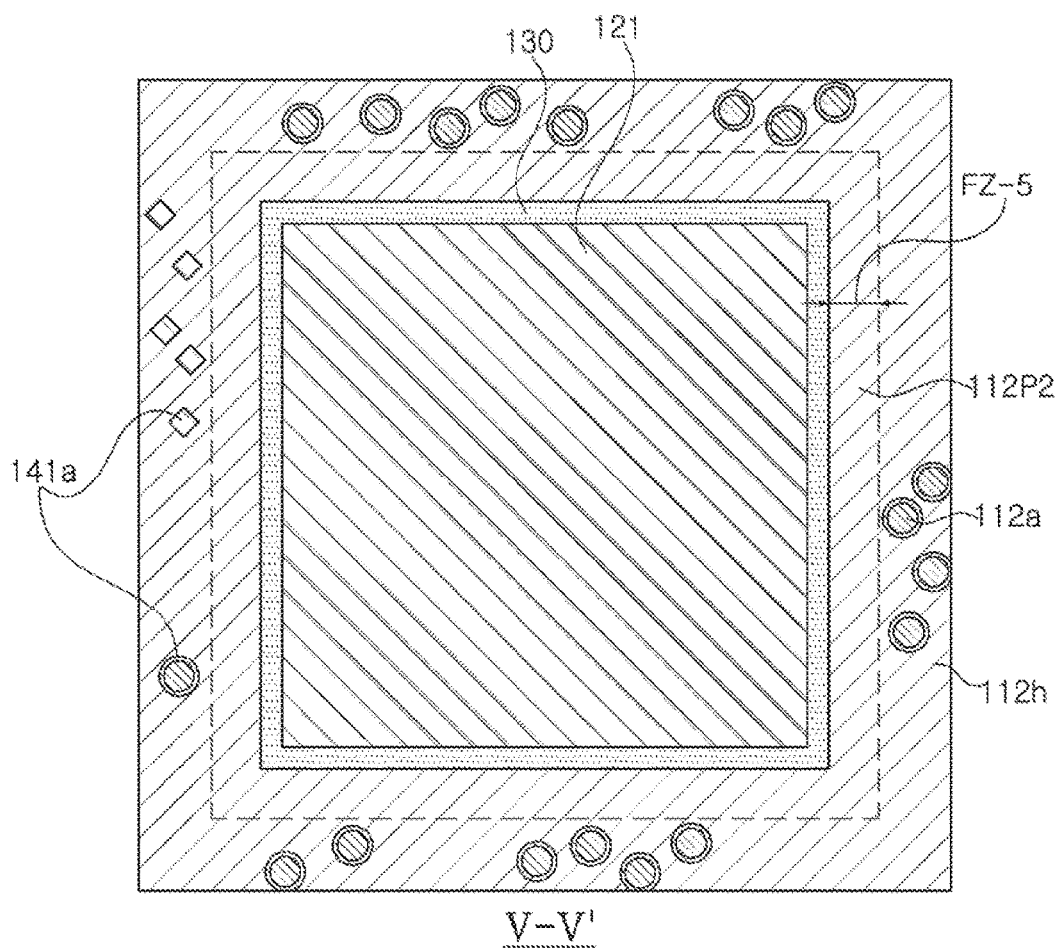
FIG. 20 is a schematic plan view taken along line V-V' of the fan-out semiconductor package of FIG. 19.

FIG. 20 is a schematic plan view taken along line V-V' of the fan-out semiconductor package of FIG. 19.

Referring to the drawings, a fan-out semiconductor package 100E according to another exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an under-bump metal layer 160 disposed in openings 151 of the passivation layer 150, and connection terminals 170 disposed on the under-bump metal layer 160. The first interconnection member 110 may include an insulating layer 111 in contact with the second interconnection member 140, a first redistribution layer 112a in contact with the second interconnection member 140, and a blocking layer FZ-5 in contact with the second interconnection member 140 and the encapsulant 130 and surrounding the through-hole 110H. An interface between the blocking layer FZ-5 and the second interconnection member 140 may be disposed on a level h5 different from that of an interface between the insulating layer 111 of the first interconnection member 110 and the second interconnection member 140.

In a case in which the blocking layer FZ-5 surrounding the through-hole 110H, more specifically, continuously surrounding the through-hole 110H, is introduced at a portion of the first interconnection member 110 in contact with the second interconnection member 140, that is, a lower portion of the first interconnection member 110 attached to an adhesive member, or the like, in an encapsulating process, as in the fan-out semiconductor package 100E according to another exemplary embodiment, a material for forming the encapsulant 130 is blocked by the blocking layer FZ-5, such that the material may not bleed into the first distribution layer 112a disposed at a lower portion of the first interconnection member 110. Therefore, the problem as described above may be improved. The blocking layer FZ-5 may be a plating layer 112P2 formed on the insulating layer 111 and a wall of the through-hole 110H. That is, the plating layer 112P2 continuously surrounding the through-hole 110H may be formed separately from the first redistribution layer 112a on the insulating layer 111 to be thus used as the blocking layer FZ-5. Therefore, in another exemplary embodiment, the interface between the blocking layer FZ-5 and the second interconnection member 140 may be disposed on the level h5 different from that of the interface between the insulating layer 111 of the first interconnection member 110 and the second interconnection member 140. That is, the blocking layer FZ-5 and the first redistribution layer 112a of the first interconnection member 110 may be disposed on the same level. Meanwhile, the plating layer 112P2 may also be formed on the wall of the through-hole 110H to thus serve as a heat dissipation member effectively dissipating heat, or the like, generated by the semiconductor chip 120. In addition, the plating layer 112P2 may also serve as an electromagnetic wave blocking part blocking electromagnetic waves, or the like, generated by the semiconductor chip 120.

Meanwhile, at the lower portion of the first interconnection member 110 in contact with the second interconnection member 140, when a region surrounding the through-hole 110H is a first region and a region surrounding the first region is a second region, the blocking layer FZ-5 may be disposed in the first region, and the first redistribution layer 112a may be disposed in the second region. When this disposition form is satisfied, the blocking layer FZ-5 may block the encapsulant 130 bleeding into the lower portion of the first interconnection member 110 through the through-hole 110H. That is, a lower surface of the blocking layer FZ-5 may be in contact with the second interconnection member 140, and a side surface thereof may be in contact with the encapsulant 130. In addition to the first redistribution layer 112a, a metal layer 112h may be further disposed in the second region. The metal layer 112h may be a dummy pattern for increasing a metal ratio in order to suppress warpage, or the like. If necessary, the metal layer 112h may be used as a ground. The metal layer 112h may be connected to the plating layer 112P2 or be disconnected from the plating layer 112P2, depending on its function. The first region may have an area greater than that of the second region.

The respective components included in the fan-out semiconductor package 100E according to another exemplary embodiment will hereinafter be described in more detail, but a description of contents overlapping those described above will be omitted.

The first interconnection member 110 may include the insulating layer 111, the first redistribution layer 112a in contact with the second interconnection member 140 and disposed on the insulating layer 111, and a second redistribution layer 112b disposed on the other surface of the insulating layer 111 opposing one surface of the insulating layer 111 on which the first redistribution layer 112a is disposed. In addition, the first interconnection member 110 may include vias (not illustrated) penetrating through the insulating layer 111 and electrically connecting the first and second redistribution layers 112a and 112b to each other. A portion of the first interconnection member 110 serving as the blocking layer FZ-5 may be disposed on the same level as that of the first redistribution layer 112a, and the other portion thereof may include the plating layer 112P2 disposed on the wall of the through-hole 110H. The plating layer 112P1 may continuously surround the through-hole 110H to be thus utilized as the blocking layer FZ-5.

The plating layer 112P2 used as the blocking layer FZ-5 may include a conductive material such as copper (Cu), aluminum (Al), silver (Ag), tin (Sn), gold (Au), nickel (Ni), lead (Pb), titanium (Ti), or alloys thereof. The plating layer 112P2 may be formed together with the first redistribution layer 112a when the first redistribution layer 112a is formed. The plating layer 112P2 may have a thickness equal to or greater than that of the first redistribution layer 112a, and in a case in which the plating layer 112P2 has a thickness smaller than that of the first redistribution layer 112a, the encapsulant 130 may bleed into a gap between plating layer 112P2 and the first redistribution layer 112a, such that the plating layer 112P2 may not appropriately serve as the blocking layer FZ-5.

Figure 21:
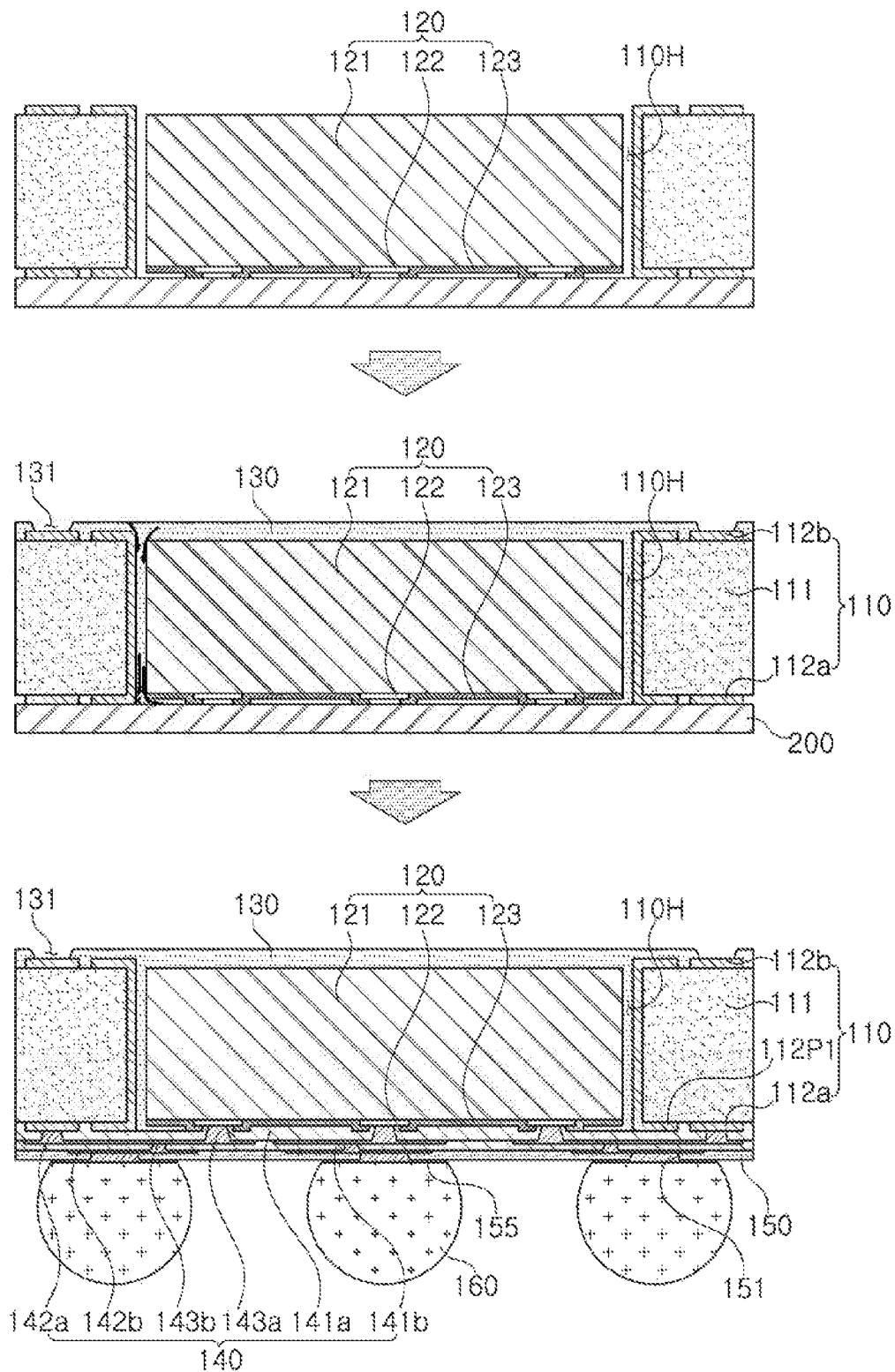
FIG. 21 is schematic views illustrating an example of processes of manufacturing the fan-out semiconductor package of FIG. 19.

FIG. 21 is schematic views illustrating an example of processes of manufacturing the fan-out semiconductor package of FIG. 19.

Referring to the drawing, the first interconnection member 110 may be first manufactured. The first interconnection member 110 may be manufactured by preparing the insulating layer 111, forming the through-hole 110H penetrating through the insulating layer 111 using laser or mechanical drilling, and forming the first redistribution layer 112a, the second redistribution layer 112b, the metal layer 112h, the plating layer 112P2, the vias (not illustrated), and the like, on opposite surfaces and a wall of the insulating layer 111 using a modified semi-additive process (MSAP), or the like. Then, the first interconnection member 110 may be attached to a support 200 such as an adhesive member, or the like, and the semiconductor chip 120 may be attached to the support 200 to be disposed in a face-down form in the through-hole 110H of the first interconnection member 110.

Then, at least portions of the first interconnection member 110 and the semiconductor chip 120 may be encapsulated with the encapsulant 130. A material for forming the encapsulant 130 may cover an upper surface of the first interconnection member 110 and an upper surface of the semiconductor chip 120, and be then filled in the through-hole 110H. In this case, when the first interconnection member 110 has the plating layer 112P2 continuously surrounding the through-hole 110H as in another exemplary embodiment, a phenomenon in which the material for forming the encapsulant 130 bleeds into the first redistribution layer 112a may be prevented. The encapsulant 130 may be formed by forming the material for forming the encapsulant 130 by a known lamination method or applying method and then hardening the material.

Then, the support 200 may be removed, and the second interconnection member 140 may be formed in a region in which the support 200 is removed. The second interconnection member 140 may be formed by sequentially forming the insulating layers 141a and 141b and then forming the redistribution layers 142a and 142b and the vias 143a and 143b on and in the insulating layers 141a and 141b, respectively. Then, the openings 151 of the passivation layer may be formed, and the under-bump metal layer 160 may be formed in the openings 151 by a known metallization method. Then, the connection terminals 170 may be formed on the under-bump metal layer 160. A method of forming the connection terminals 170 is not particularly limited. That is, the connection terminals 170 may be formed by the method well-known in the related art depending on their structures or forms. The connection terminals 170 may be fixed by reflow, and portions of the connection terminals 170 may be embedded in the passivation layer 150 in order to enhance fixing force, and the remaining portions of the connection terminals 170 may be externally exposed, such that reliability may be improved. If necessary, the openings 131 exposing the second redistribution layer 112b of the first interconnection member 110 may be formed in order to be used for marking, connection of a package-on-package (POP), mounting of a surface mount technology (SMT) component, and the like.

Meanwhile, a series of processes may be processes of preparing the insulating layer 111 having a large size, manufacturing a plurality of fan-out semiconductor packages 100E through the abovementioned process, and then singulating the plurality of fan-out semiconductor packages into individual fan-out semiconductor packages 100E through a cutting process in order to facilitate mass production. In this case, productivity may be excellent.

Figure 22:
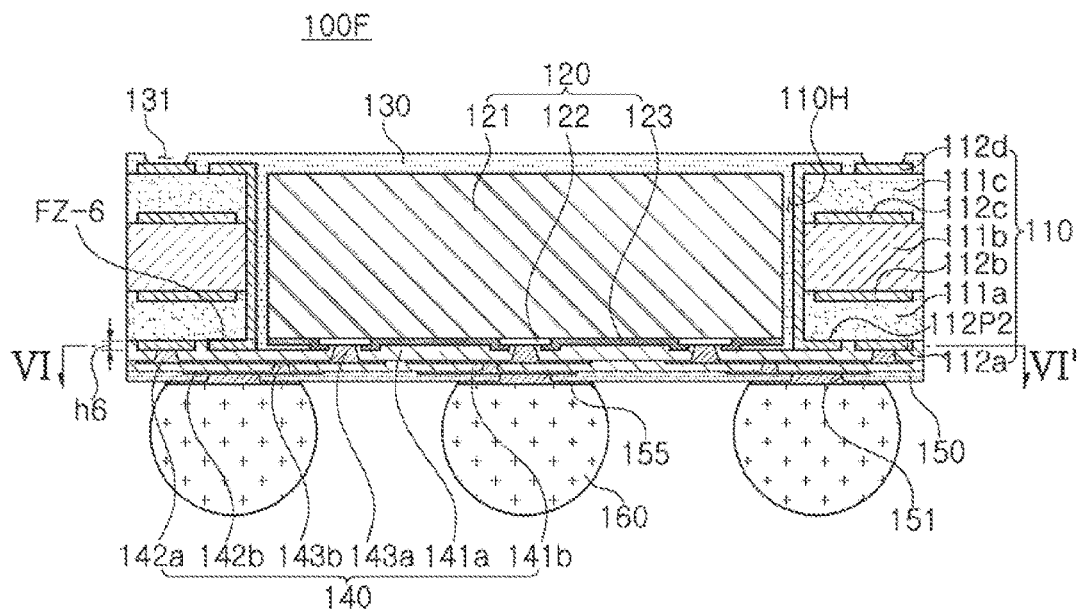
FIG. 22 is a schematic cross-sectional view illustrating another example of a fan-out semiconductor package.

FIG. 22 is a schematic cross-sectional view illustrating another example of a fan-out semiconductor package.

Figure 23:
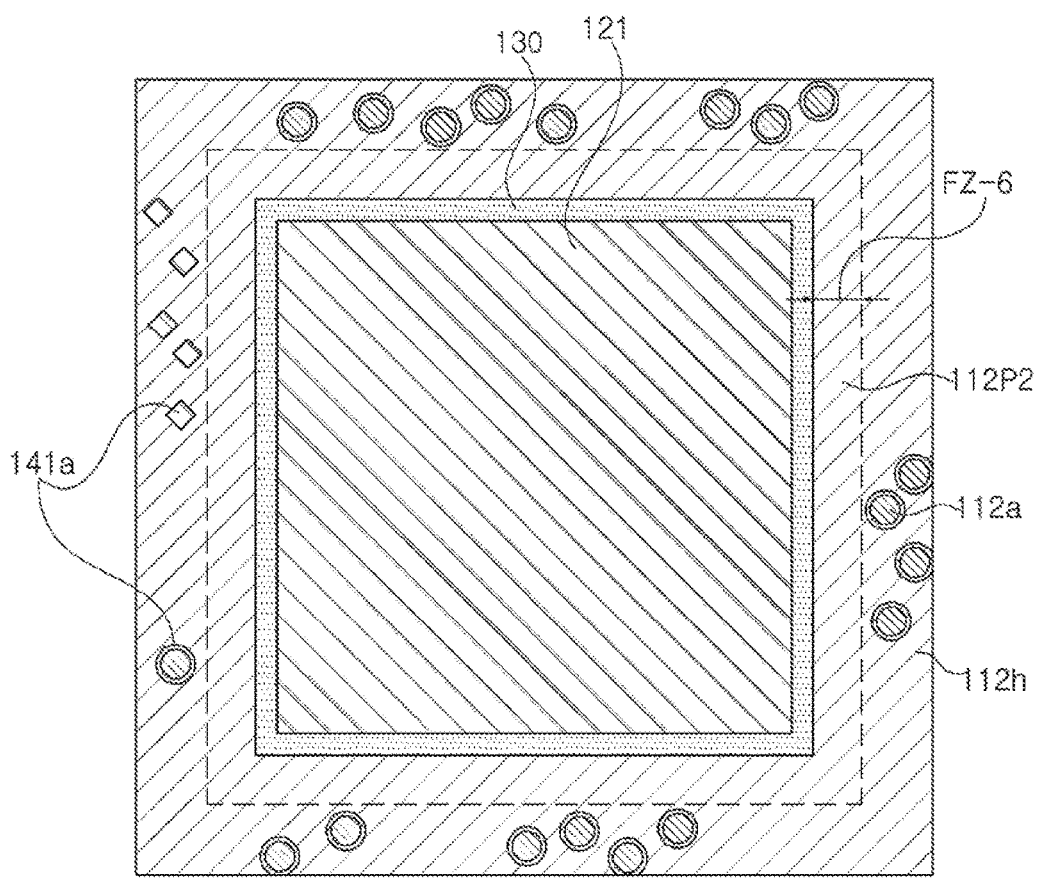
FIG. 23 is a schematic plan view taken along line VI-VI' of the fan-out semiconductor package of FIG. 22.

FIG. 23 is a schematic plan view taken along line VI-VI' of the fan-out semiconductor package of FIG. 22.

Referring to the drawings, a fan-out semiconductor package 100F according to another exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a passivation layer 150 disposed on the second interconnection member 140, an under-bump metal layer 160 disposed in openings 151 of the passivation layer 150, and connection terminals 170 disposed on the under-bump metal layer 160. The first interconnection member 110 may include a first insulating layer 111a in contact with the second interconnection member 140, a first redistribution layer 112a in contact with the second interconnection member 140, and a blocking layer FZ-6 in contact with the second interconnection member 140 and the encapsulant 130 and surrounding the through-hole 110H. An interface between the blocking layer FZ-6 and the second interconnection member 140 may be disposed on a level h6 different from that of an interface between the first insulating layer 111a of the first interconnection member 110 and the second interconnection member 140.

In a case in which the blocking layer FZ-6 surrounding the through-hole 110H, more specifically, continuously surrounding the through-hole 110H, is introduced at a portion of the first interconnection member 110 in contact with the second interconnection member 140, that is, a lower portion of the first interconnection member 110 attached to an adhesive member, or the like, in an encapsulating process, as in the fan-out semiconductor package 100F according to another exemplary embodiment, a material for forming the encapsulant 130 is blocked by the blocking layer FZ-6, such that the material may not bleed into the first distribution layer 112a disposed at a lower portion of the first interconnection member 110. Therefore, the problem as described above may be improved. The blocking layer FZ-6 may be a plating layer 112P2 formed on the first insulating layer 111*a* and a wall of the through-hole 110H. That is, the plating layer 112P2 continuously surrounding the through-hole 110H may be formed separately from the first redistribution layer 112*a* on the first insulating layer 111*a* to be thus used as the blocking layer FZ-6. Therefore, in another exemplary embodiment, the interface between the blocking layer FZ-6 and the second interconnection member 140 may be disposed on the level h6 different from that of the interface between the first insulating layer 111*a* of the first interconnection member 110 and the second interconnection member 140. That is, the blocking layer FZ-6 and the first redistribution layer 112*a* of the first interconnection member 110 may be disposed on the same level. Meanwhile, the plating layer 112P2 may also be formed on the wall of the through-hole 110H to thus serve as a heat dissipation member effectively dissipating heat, or the like, generated by the semiconductor chip 120. In addition, the plating layer 112P2 may also serve as an electromagnetic wave blocking part blocking electromagnetic waves, or the like, generated by the semiconductor chip 120. The plating layer 112P2 may have a thickness equal to or greater than that of the first redistribution layer 112*a*.

At the lower portion of the first interconnection member 110 in contact with the second interconnection member 140, when a region surrounding the through-hole 110H is a first region and a region surrounding the first region is a second region, the blocking layer FZ-6 may be disposed in the first region, and the first redistribution layer 112*a* may be disposed in the second region. When this disposition form is satisfied, the blocking layer FZ-6 may block the encapsulant 130 bleeding into the lower portion of the first interconnection member 110 through the through-hole 110H. That is, a lower surface of the blocking layer FZ-6 may be in contact with the second interconnection member 140, and a side surface thereof may be in contact with the encapsulant 130. In addition to the first redistribution layer 112*a*, a metal layer 112*h* may be further disposed in the second region. The metal layer 112*h* may be a dummy pattern for increasing a metal ratio in order to suppress warpage, or the like. If necessary, the metal layer 112*h* may be used as a ground. The metal layer 112*h* may be connected to the plating layer 112P2 or be disconnected from the plating layer 112P2, depending on its function. The first region may have an area greater than that of the second region.

The first interconnection member 110 may include a second insulating layer 111*b*, a second redistribution layer 112*b* and a third redistribution layer 112*c* disposed on opposite surfaces of the second insulating layer 111*b*, respectively, the first insulating layer 111*a* disposed on the second insulating layer 111*b* and covering the second redistribution layer 112*b*, the first redistribution layer 112*a* disposed on the first insulating layer 111*a*, a third insulating layer 111*c* disposed on the second insulating layer 111*b* and covering the third redistribution layer 112*c*, and a fourth redistribution layer 112*d* disposed on the third insulating layer 111*c*. Since the first interconnection member 110 may include a larger number of redistribution layers 112*a*, 112*b*, 112*c*, and 112*d*, a second interconnection member 140 may be further simplified. Therefore, a decrease in a yield depending on a defect occurring in a process of forming the second interconnection member 140 may be improved. Meanwhile, although not illustrated in the drawing, the first to fourth redistribution layers 112*a*, 112*b*, 112*c*, and 112*d* may be electrically connected to each other by vias (not illustrated) penetrating through the first to third insulating layers 111*a*, 111*b*, and 111*c*.

The second insulating layer 111*b* may have a thickness greater than those of the first insulating layer 111*a* and the third insulating layer 111*c*. The second insulating layer 111*b* may be relatively thick in order to basically maintain rigidity, and the first insulating layer 111*a* and the third insulating layer 111*c* may be introduced in order to form a larger number of redistribution layers 112*a* and 112*d*. The second insulating layer 111*b* may include an insulating material different from those of the first insulating layer 111*a* and the third insulating layer 111*c*. For example, the second insulating layer 111*b* may be formed of, for example, prepreg including a core material, an inorganic filler, and an insulating resin, and the first insulating layer 111*a* and the third insulating layer 111*c* may be formed of an ABF or a photosensitive insulating film including an inorganic filler and an insulating resin. However, materials of the first to third insulating layers 111*a*, 111*b*, and 111*c* are not necessarily limited thereto.

A lower surface of the first redistribution layer 112*a* of the first interconnection member 110 may be disposed on a level below a lower surface of the connection pad 122 of the semiconductor chip 120. In addition, a distance between a redistribution layer 142*a* of the second interconnection member 140 and the first redistribution layer 112*a* of the first interconnection member 110 may be smaller than that between the redistribution layer 142*a* of the second interconnection member 140 and the connection pad 122 of the semiconductor chip 120. Here, the first redistribution layer 112*a* may be disposed in a protruding form on the first insulating layer 111*a*, resulting in contact with the second interconnection member 140. The second redistribution layer 112*b* and the third redistribution layer 112*c* of the first interconnection member 110 may be disposed on a level between the active surface and the inactive surface of the semiconductor chip 120. The first interconnection member 110 may be formed at have a thickness corresponding to that of the semiconductor chip 120. Therefore, the second redistribution layer 112*b* and the third redistribution layer 112*c* formed in the first interconnection member 110 may be disposed on the level between the active surface and the inactive surface of the semiconductor chip 120. Thicknesses of the redistribution layers 112*a*, 112*b*, 112*c*, and 112*d* of the first interconnection member 110 may be greater than those of the redistribution layers 142*a* and 142*b* of the second interconnection member 140. Since the first interconnection member 110 may have a thickness equal to or greater than that of the semiconductor chip 120, the redistribution layers 112*a*, 112*b*, 112*c*, and 112*d* may also be formed to have large sizes. On the other hand, the redistribution layers 142*a* and 142*b* of the second interconnection member 140 may be formed to be relatively small for thinness.

A description of configurations other than the abovementioned configuration and a method for manufacturing the fan-out semiconductor package 100F overlaps that described above in the fan-out semiconductor package 100A and the fan-out semiconductor package 100E, and is thus omitted.

Figure 24:
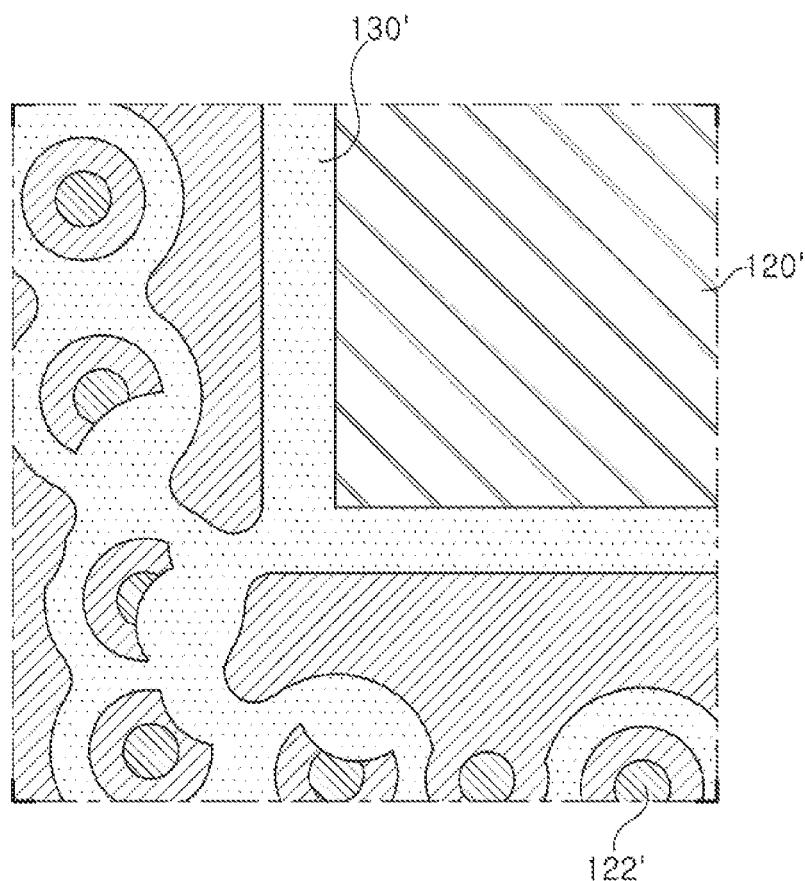
FIG. 24 is a schematic plan view illustrating a case in which a bleeding defect due to an encapsulant occurs.

FIG. 24 is a schematic plan view illustrating a case in which a bleeding defect due to an encapsulant occurs.

Referring to the drawing, as described above, in a case in which the first interconnection member does not have the blocking layer FZ-1, FZ-2, FZ-3, FZ-4, FZ-5, or FZ-6, the encapsulant 130' may bleed into the redistribution layer 112' formed at the lower portion of the first interconnection member 110' in the encapsulating process to pollute the redistribution layer 112'. In this case, when the second interconnection member is formed in the subsequent process, reliability problems such as an open defect, a connectivity decrease, an electrical short-circuit, and the like, of vias connected to the redistribution layer 112' may occur. In addition, this bleeding may also pollute connection pads disposed on a lower surface of the semiconductor chip 120'.

As set forth above, according to the exemplary embodiment in the present disclosure, a fan-out semiconductor package in which a bleeding defect due to an encapsulant may be improved may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a first interconnection member having a through-hole;
a semiconductor chip disposed in the through-hole and having an active surface having connection pads disposed thereon and an inactive surface opposing the active surface;
a second interconnection member including an insulating layer disposed on the first interconnection member and the active surface of the semiconductor chip and a redistribution layer disposed on the insulating layer and electrically connected to the connection pads; and
an encapsulant encapsulating at least portions of the first interconnection member and the inactive surface of the semiconductor chip,
wherein the first interconnection member includes a first insulating layer in contact with the insulating layer of the second interconnection member, a first redistribution layer disposed on a surface of the first insulating layer in contact with the insulating layer of the second interconnection member and electrically connected to the connection pads, and a blocking layer disposed on the surface of the first insulating layer on which the first redistribution layer is disposed and completely surrounding the through-hole, and
the blocking layer separates the encapsulant from a portion of the insulating layer of the second interconnection member that is in contact with the first insulating layer or the first redistribution layer of the first interconnection member.

2. The semiconductor package of claim 1, wherein the blocking layer completely surrounds the through-hole.

3. The semiconductor package of claim 1, wherein the blocking layer is in contact with the encapsulant and the portion of the insulating layer of the second interconnection member that is in contact with the first insulating layer or the first redistribution layer of the first interconnection member, and
a lower surface of the blocking layer is in contact with the second interconnection member.

4. The semiconductor package of claim 1, wherein an interface between the blocking layer and the second interconnection member is disposed on a level different from that of at least one of an interface between the first redistribution layer and the second interconnection member and an interface between the first insulating layer and the second interconnection member.

5. The semiconductor package of claim 1, wherein one surface of the first interconnection member in contact with the second interconnection member includes a first region surrounding the through-hole and a second region surrounding the first region,
the blocking layer of the first interconnection member is disposed in the first region, and
the first redistribution layer of the first interconnection member is disposed in the second region.

6. The semiconductor package of claim 5, wherein the blocking layer is a portion of the first insulating layer of the first interconnection member, and
the first redistribution layer of the first interconnection member is disposed on a recessed portion of the first insulating layer with respect to the blocking layer.

7. The semiconductor package of claim 5, wherein the blocking layer is a plating layer formed on the first insulating layer of the first interconnection member, and
the first redistribution layer of the first interconnection member is disposed on the same level as that of the blocking layer.

8. The semiconductor package of claim 7, wherein the plating layer has a thickness equal to or greater than that of the first redistribution layer of the first interconnection member.

9. The semiconductor package of claim 1, wherein the first interconnection member includes the first insulating layer, the first redistribution layer in contact with the second interconnection member and embedded in the first insulating layer, and a second redistribution layer disposed on the other surface of the first insulating layer opposing one surface of the first insulating layer in which the first redistribution layer is embedded.

10. The semiconductor package of claim 9, wherein the first interconnection member further includes a second insulating layer disposed on the first insulating layer and covering the second redistribution layer and a third redistribution layer disposed on the second insulating layer.

11. The fan-out semiconductor package of claim 10, wherein the second redistribution layer is disposed on a level between the active surface and the inactive surface of the semiconductor chip.

12. The semiconductor package of claim 9, wherein a distance between the redistribution layer of the second interconnection member and the first redistribution layer is greater than that between the redistribution layer of the second interconnection member and each of the connection pads.

13. The semiconductor package of claim 9, wherein a lower surface of the first redistribution layer is disposed on a level above a lower surface of each of the connection pads.

14. The semiconductor package of claim 1, wherein the first interconnection member includes a second insulating layer, a second redistribution layer and a third redistribution layer disposed on opposite surfaces of the second insulating layer, respectively, the first insulating layer disposed on the second insulating layer and covering the second redistribution layer, and the first redistribution layer disposed on the first insulating layer.

15. The semiconductor package of claim 14, wherein the first interconnection member further includes a third insulating layer disposed on the second insulating layer and covering the third redistribution layer and a fourth redistribution layer disposed on the third insulating layer.

16. The fan-out semiconductor package of claim 14, wherein the second insulating layer has a thickness greater than that of the first insulating layer.

17. The semiconductor package of claim 14, wherein the second redistribution layer is disposed on a level between the active surface and the inactive surface of the semiconductor chip.

18. The semiconductor package of claim 14, wherein a lower surface of the first redistribution layer is disposed on a level below a lower surface of each of the connection pads.

19. A semiconductor package comprising:
a first interconnection member having a through-hole;
a semiconductor chip disposed in the through-hole and having an active surface having connection pads disposed thereon and an inactive surface opposing the active surface;
a second interconnection member disposed on the first interconnection member and the active surface of the semiconductor chip and including a redistribution layer electrically connected to the connection pads; and
an encapsulant encapsulating at least portions of the first interconnection member and the inactive surface of the semiconductor chip,
wherein the first interconnection member includes a first insulating layer in contact with the second interconnection member, a first redistribution layer disposed on a surface of the first insulating layer in contact with the second interconnection member and electrically connected to the connection pads, and a blocking layer disposed on the surface of the first insulating layer on which the first redistribution layer is disposed and surrounding the through-hole, and the blocking layer is closer to the through-hole than to the first redistribution layer of the first interconnection member.

20. A semiconductor package comprising:
a first interconnection member having a through-hole;
a semiconductor chip disposed in the through-hole and having an active surface having connection pads disposed thereon and an inactive surface opposing the active surface;
a second interconnection member disposed on the first interconnection member and the active surface of the semiconductor chip and including a redistribution layer electrically connected to the connection pads; and
an encapsulant encapsulating at least portions of the first interconnection member and the inactive surface of the semiconductor chip,
wherein the first interconnection member includes a first insulating layer in contact with the second interconnection member, a first redistribution layer disposed on a surface of the first insulating layer in contact with the second interconnection member and electrically connected to the connection pads, and a blocking layer disposed on the surface of the first insulating layer on which the first redistribution layer is disposed and completely surrounding the through-hole, and
the encapsulant does not contact the surface of the first insulating layer on which the first redistribution layer is disposed.

* * * * *